(12) United States Patent
Huang

(10) Patent No.: US 11,424,346 B2
(45) Date of Patent: Aug. 23, 2022

(54) SEMICONDUCTOR DEVICE WITH PROGRAMMABLE FEATURE AND METHOD FOR FABRICATING THE SAME

(71) Applicant: NANYA TECHNOLOGY CORPORATION, New Taipei (TW)

(72) Inventor: Chin-Ling Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 81 days.

(21) Appl. No.: 16/916,654

(22) Filed: Jun. 30, 2020

(65) Prior Publication Data

US 2021/0408264 A1 Dec. 30, 2021

(51) Int. Cl.
*H01L 29/66* (2006.01)
*H01L 21/8234* (2006.01)
*H01L 29/78* (2006.01)
*H01L 29/417* (2006.01)

(52) U.S. Cl.
CPC .. *H01L 29/6681* (2013.01); *H01L 21/823431* (2013.01); *H01L 29/41791* (2013.01); *H01L 29/785* (2013.01)

(58) Field of Classification Search
CPC .......... H01L 29/6681; H01L 29/41791; H01L 29/785; H01L 21/823431
See application file for complete search history.

(56) References Cited

U.S. PATENT DOCUMENTS

| | | | |
|---|---|---|---|
| 2008/0102557 A1* | 5/2008 | Kim | H01L 21/76224 438/73 |
| 2013/0069160 A1* | 3/2013 | Aquilino | H01L 29/7834 257/368 |
| 2016/0190151 A1* | 6/2016 | Yang | H01L 27/11578 257/324 |

* cited by examiner

*Primary Examiner* — Christine A Enad
(74) *Attorney, Agent, or Firm* — Muncy, Geissler, Olds & Lowe, P.C.

(57) ABSTRACT

The present application discloses a semiconductor device with a programmable feature such as anti-fuse and a method for fabricating the semiconductor device. The semiconductor device includes a first insulating layer including a peak portion and an upper portion positioned on the peak portion, and first conductive blocks positioned on two sides of the peak portion. A width of the peak portion is gradually decreased toward a direction opposite to the upper portion, and the first conductive blocks are spaced apart by the peak portion.

12 Claims, 26 Drawing Sheets

SEMICONDUCTOR DEVICE WITH PROGRAMMABLE FEATURE AND METHOD FOR FABRICATING THE SAME

TECHNICAL FIELD

The present disclosure relates to a semiconductor device and a method for fabricating the semiconductor device, and more particularly, to a semiconductor device with a programmable feature such as anti-fuse and a method for fabricating the semiconductor device with the programmable feature.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first insulating layer including a peak portion and an upper portion positioned on the peak portion, and first conductive blocks positioned on two sides of the peak portion. A width of the peak portion is gradually decreased toward a direction opposite to the upper portion, and the first conductive blocks are spaced apart by the peak portion.

In some embodiments, the semiconductor device includes first spacers positioned on two sides of the upper portion.

In some embodiments, the semiconductor device includes a top insulating layer positioned on sides of the first spacers.

In some embodiments, a bottom surface of the top insulating layer is at a vertical level above a vertical level of bottom surfaces of the first spacers.

In some embodiments, a top surface of the first insulating layer and top surfaces of the first conductive blocks are substantially coplanar.

In some embodiments, a bottommost point of the peak portion is at a same vertical level as bottom surfaces of the first conductive blocks.

In some embodiments, a bottommost point of the peak portion is at a vertical level lower than a vertical level of bottom surfaces of the first conductive blocks.

In some embodiments, an angle between the two sides of the peak portion is between about 60 degree and about 80 degree.

In some embodiments, the semiconductor device includes a buried insulating layer positioned below the first conductive blocks, wherein a lower part of the peak portion is extending to an upper portion of the buried insulating layer.

In some embodiments, the semiconductor device includes a bottom layer positioned below the buried insulating layer.

Another aspect of the present disclosure provides a semiconductor device including a first insulating layer including a peak portion having a V-shaped cross-sectional profile and upper portions positioned on two ends of the peak portion, and first conductive blocks positioned on two sides of the peak portion. The first conductive blocks are spaced apart by the peak portion.

In some embodiments, the semiconductor device includes a first filler layer positioned on the peak portion and positioned between the upper portions.

In some embodiments, the semiconductor device includes a first work function layer positioned between the first insulating layer and the first filler layer.

In some embodiments, a bottommost point of the peak portion is at a vertical level lower than a vertical level of bottom surfaces of the first conductive blocks.

In some embodiments, the semiconductor device includes a buried insulating layer positioned below the first conductive blocks. The peak portion is extending to an upper portion of the buried insulating layer.

Another aspect of the present disclosure provides a method for fabricating a semiconductor device including forming a semiconductor fin on a buried insulating layer, forming a dummy gate structure on the semiconductor fin, forming a top insulating layer over the semiconductor fin and covering the dummy gate structure, removing the dummy gate structure and concurrently forming a first trench in the top insulating layer, performing an etch process in the first trench to form a tapered pit separating the semiconductor fin, forming a first insulating layer to completely fill the first trench and the tapered pit, and replacing the semiconductor fin with first conductive blocks.

In some embodiments, the step of replacing the semiconductor fin into the first conductive blocks includes forming contact openings in the top insulating layer, removing the semiconductor fin through the contact openings and concurrently forming first voids on two sides of the first insulating layer, and forming the first conductive blocks to completely fill the first voids.

In some embodiments, the etch process includes using an alkaline aqueous based etchant in the first trench to form the tapered pit.

In some embodiments, sidewalls of the tapered pit have <111> crystal orientation.

In some embodiments, the method for fabricating the semiconductor device includes a step of forming impurity regions on the semiconductor fin before the step of forming the top insulating layer over the semiconductor fin and covering the dummy gate structure.

Due to the design of the semiconductor device of the present disclosure, the position of the rupture point of the first insulating layer may be easily limited in the place adjacent to the vertex of the peak portion having the highest electrical fields during programming. As result, the reliability of programming of the semiconductor device may be increased. In addition, the formation of the first insulating layer may be integrated with the formation of the gate insulating layer to reduce the complexity and cost of fabrication of the semiconductor device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
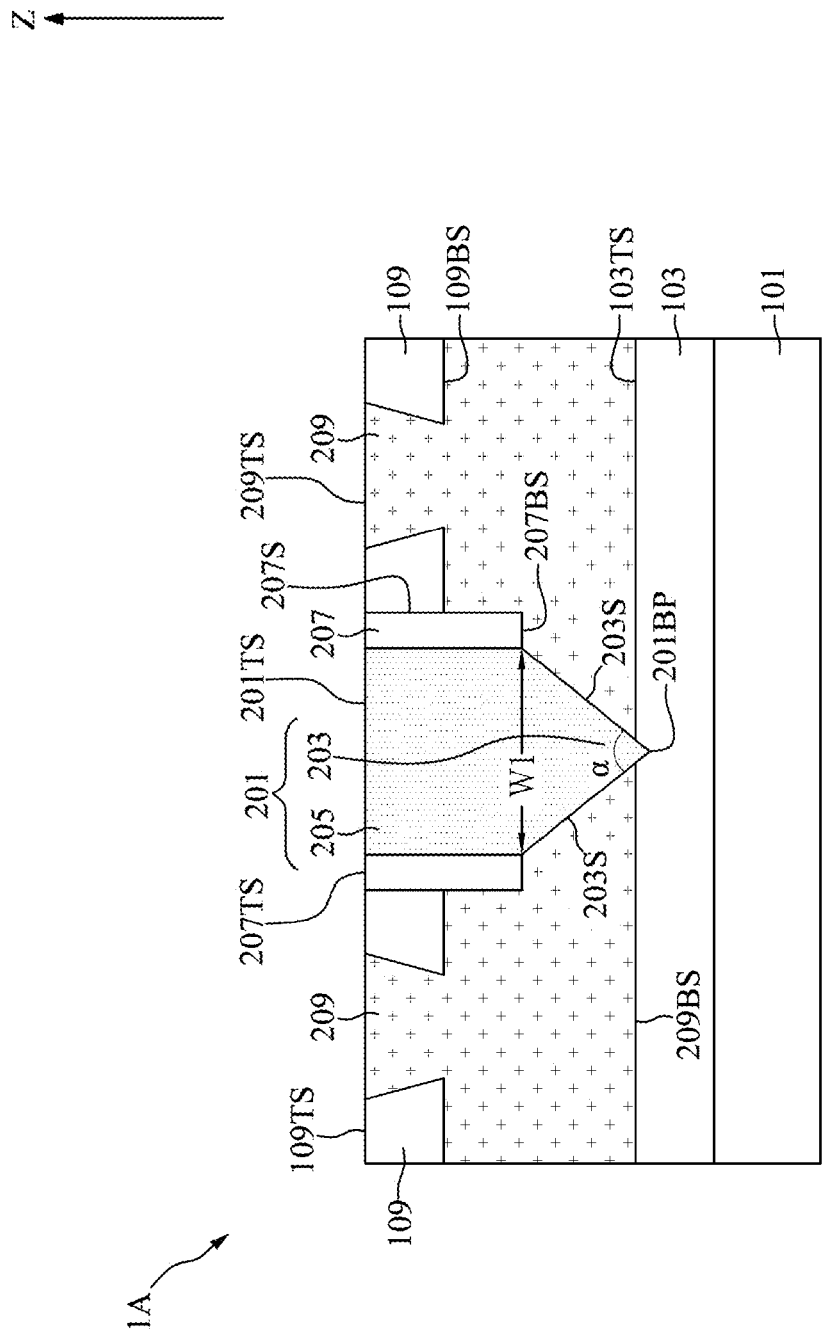
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It should be noted that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device 1A in accordance with one embodiment of the present disclosure.

With reference to FIG. 1, the semiconductor device 1A may include a bottom layer 101, a buried insulating layer 103, a top insulating layer 109, a first insulating layer 201, first spacers 207, and first conductive blocks 209.

With reference to FIG. 1, the bottom layer 101 may be formed of, for example, silicon, germanium, silicon germanium, silicon carbide, gallium arsenide, gallium phosphide, indium phosphide, indium arsenide, indium antimonide, soda-lime glass, fused silica, fused quartz, or calcium fluoride. In some embodiments, the bottom layer 101 may be single crystalline. The crystal orientation of the bottom layer 101 may be <100>, <110>, or <111>. In some embodiments, the bottom layer 101 may be polycrystalline or amorphous.

With reference to FIG. 1, the buried insulating layer 103 may be disposed on the bottom layer 101. The buried insulating layer 103 may be formed of, for example, silicon oxide, silicon nitride, or boron nitride. A thickness of the buried insulating layer 103 may be between about 10 nm and about 200 nm.

With reference to FIG. 1, the first insulating layer 201 may be disposed on the buried insulating layer 103. The first insulating layer 201 may include a peak portion 203 and an upper portion 205. The peak portion 203 may be disposed on the buried insulating layer 103. The peak portion 203 may have an invert triangular cross-sectional profile. Two sides 203S of the peak portion 203 may be tapered and may be jointed at a bottommost point 201BP of the first insulating layer 201. A width W1 (i.e., a horizontal distance between the two sides 203S of the peak portion 203) of the peak portion 203 may be gradually decreased along the direction Z toward the bottom layer 101. An angle α between the two sides 203S of the peak portion 203 may be between about 60 degree and about 80 degree. The bottommost point 201BP of the first insulating layer 201 may be at a same vertical level as a top surface 103TS of the buried insulating layer 103. The upper portion 205 may be disposed on the peak portion 203.

The first insulating layer 201 may be formed of, for example, silicon oxide. In some embodiments, the first insulating layer 201 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. Specifically, the first insulating layer 201 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof.

With reference to FIG. 1, the first spacers 207 may be disposed on two sides of the upper portion 205. The top surfaces 207TS of the first spacers 207 may be substantially coplanar with the top surface 201TS of the first insulating layer 201. The first spacers 207 may be formed of, for example, semiconductor oxides, semiconductor nitrides, semiconductor oxynitrides, semiconductor carbides, or other dielectrics. In some examples, the first spacers 207 may include alternating layers of different dielectrics such as a first semiconductor oxide spacer and a second semiconductor nitride spacer.

With reference to FIG. 1, the top insulating layer 109 may be disposed on the upper portions of the sides 207S of the first spacers 207. The top surface 109TS of the top insulating layer 109 may be substantially coplanar with the top surface 201TS of the first insulating layer 201. The bottom surface 109BS of the top insulating layer 109 may be at a vertical level higher than a vertical level of the bottom surfaces 207BS of the first spacers 207. In some embodiments, the top insulating layer 109 may be formed of, for example, silicon oxynitride, silicon nitride oxide, silicon carbon, silicon oxide, or silicon nitride. In some embodiments, the top insulating layer 109 may be formed of, for example, a low-k dielectric material having atoms of Si, C, O, B, P, N, or H. For example, the dielectric constant of the low-k dielectric material may be between about 2.4 and about 3.5 depending upon mole fractions of the aforementioned atoms. The top insulating layer 109 may have a mechanical strength sufficient to support the first spacers 207 and the first insulating layer 201.

With reference to FIG. 1, the first conductive blocks 209 may be disposed on the buried insulating layer 103 and on the two sides of the first insulating layer 201. The first conductive blocks 209 may be spaced apart by the first insulating layer 201 and the first spacers 207. Specifically, the lower portions of the first conductive blocks 209 may be disposed on the two sides 203S of the peak portion 203. The peak portion 203 may separate the first conductive blocks 209. The middle portions of the first conductive blocks 209 may be disposed on the lower portions of the sides 207S of the first spacers 207. The upper portions of the first conductive blocks 209 may be respectively correspondingly disposed penetrating the top insulating layer 109. The top surfaces 209TS of the first conductive blocks 209 may be substantially coplanar with the top surface 201TS of the first insulating layer 201. The bottom surfaces 209BS of the first conductive blocks 209 may be substantially coplanar with the top surface 103TS of the buried insulating layer 103. The first conductive blocks 209 may be formed of, for example, aluminum, copper, titanium, tungsten, cobalt, or alloys thereof.

The first insulating layer 201 and the first conductive blocks 209 together form a programmable feature such as an anti-fuse. An anti-fuse starts with a high resistance and is designed to permanently create an electrically conductive path.

During programming of the semiconductor device 1A, a programming voltage may be provided and applied to the semiconductor device 1A through the first conductive blocks 209, a channel region may be formed along the two sides 203S of the peak portion 203. A programming current may flow through the channel region and heat the area around the channel region. During programming of the semiconductor device 1A, the vertex (i.e., the bottommost point 201BP) of the peak portion 203 may be the most vulnerable part because electrical fields concentrate at the sharp profile. Since the vertex of the peak portion 203 may obtain the highest electrical fields, the first insulating layer 201 may be broken down to form a rupture point of the first insulating layer 201 adjacent to the vertex of the peak portion 203 and a resistance reduction may be induced accordingly. Consequently, the semiconductor device 1A is blown and programmed. The position of the rupture point of the first insulating layer 201 may be easily limited in the place adjacent to the vertex of the peak portion 203 having the highest electrical fields during programming. As result, the reliability of programming of the semiconductor device 1A may be increased.

Figure 2:
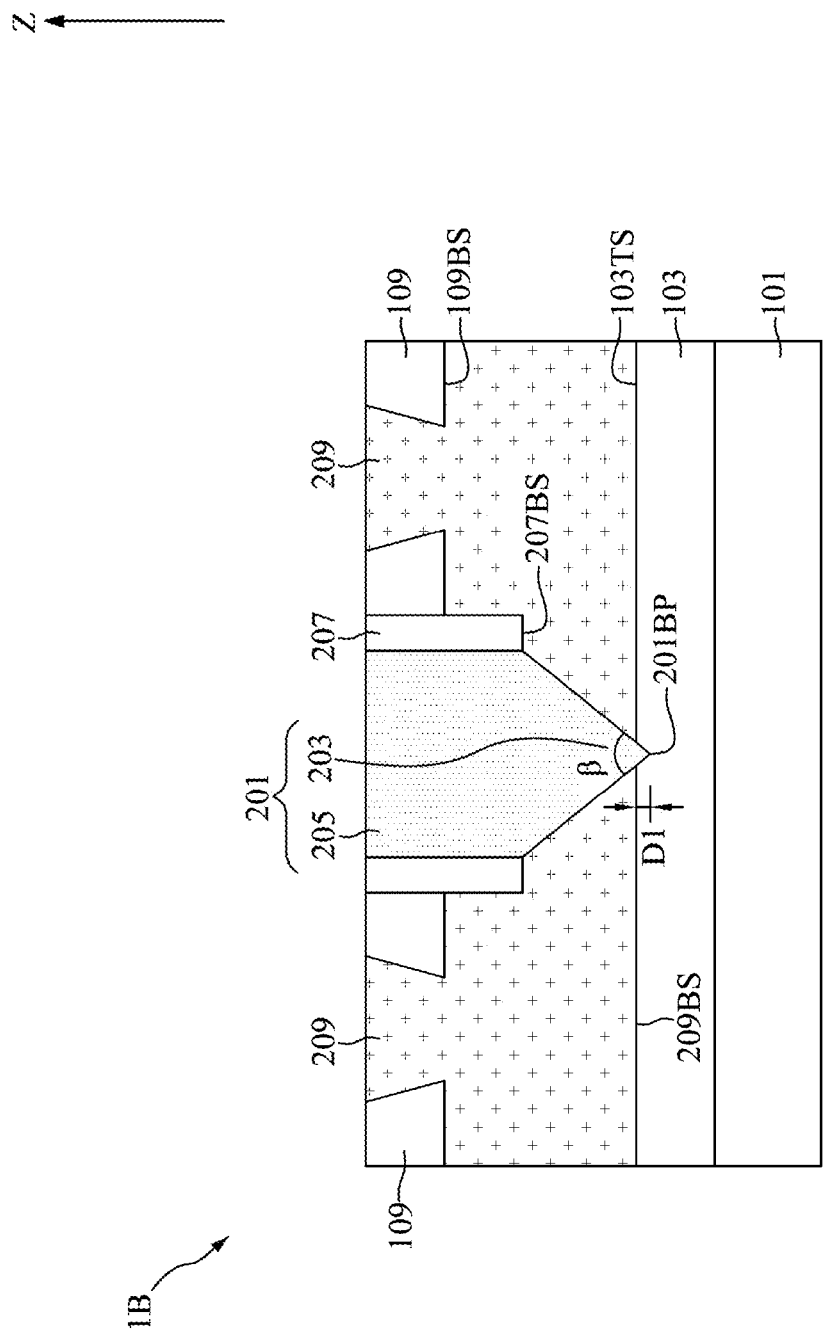
FIGS. 2 to 4 illustrate, in schematic cross-sectional view diagrams, semiconductor devices in accordance with some embodiments of the present disclosure.
Figure 3:
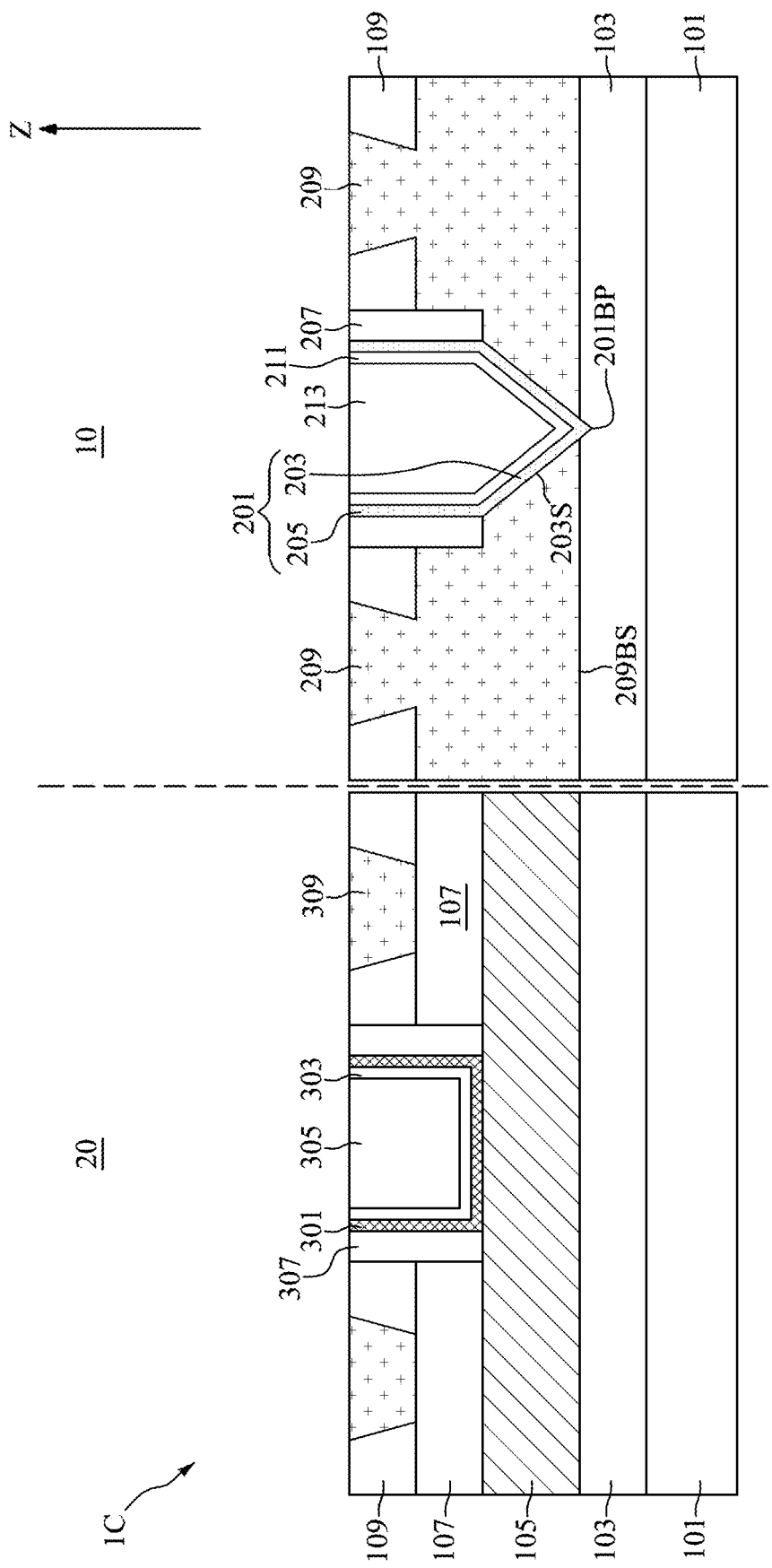
Figure 4:
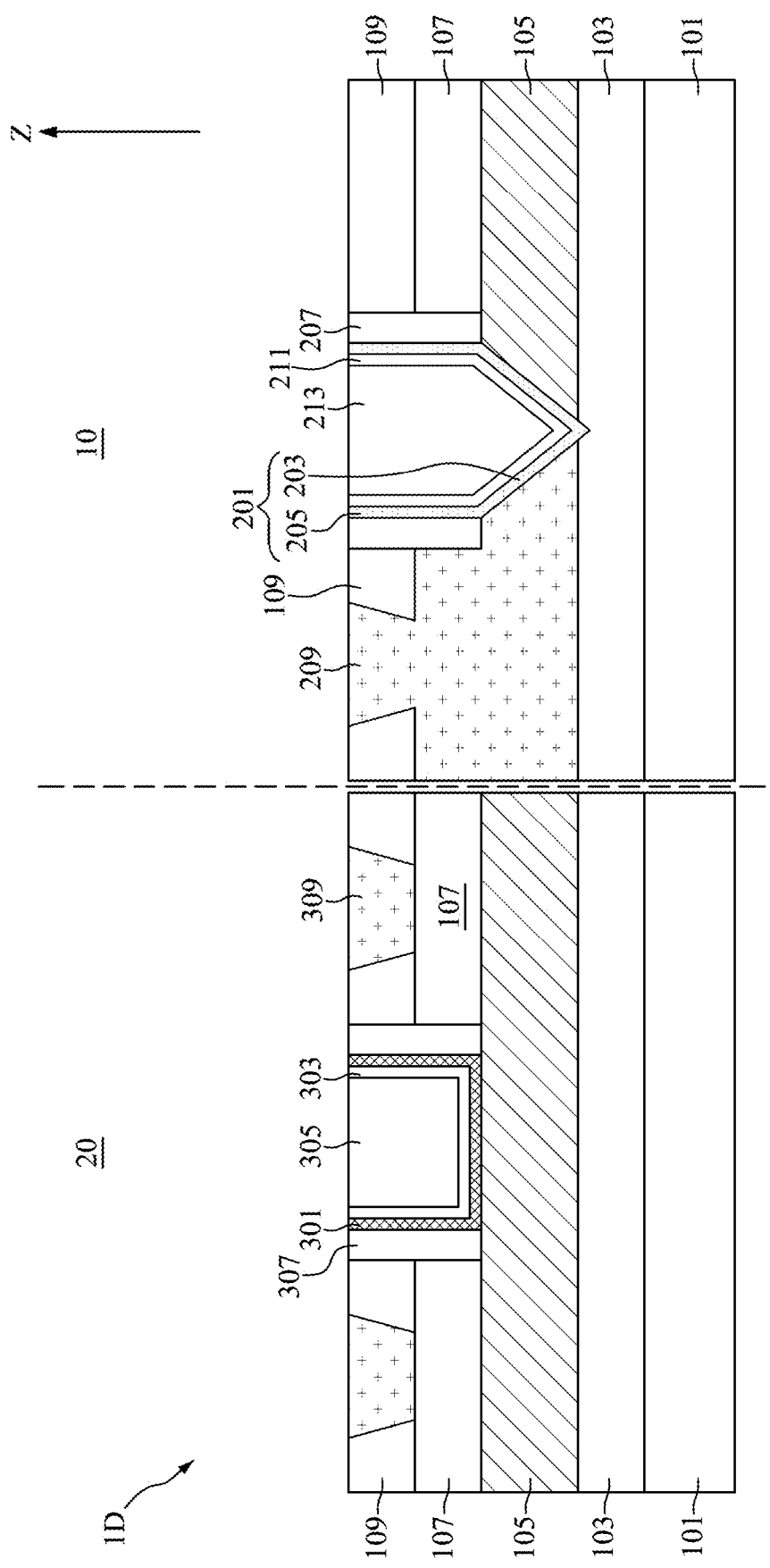

FIGS. 2 to 4 illustrate, in schematic cross-sectional view diagrams, semiconductor devices 1B, 1C, and 1D in accordance with some embodiments of the present disclosure.

With reference to FIG. 2, in the semiconductor device 1B, the peak portion 203 of the first insulating layer 201 may extend to the upper portion of the buried insulating layer 103. In other words, the bottommost point 201BP of the first insulating layer 201 may be at a vertical level lower than a vertical level of the bottom surfaces 209BS of the first conductive blocks 209. Specifically, a buried depth D1 of the peak portion 203 may be between about 1 nm and about 30 nm. An angle β between the two sides 203S of the peak portion 203 may be between about 50 degree and about 70 degree.

With reference to FIG. 3, the semiconductor device 1C may include a programmable area 10 and a functional area 20. In some embodiments, the programmable area 10 and the functional area 20 may spaced apart from each other. In some embodiments, the programmable area 10 and the functional area 20 may be located adjacent to each other. In the embodiment depicted, a programmable feature with a structure similar to that illustrated in FIG. 2 may be disposed in the programmable area 10, and a functional gate structure may be disposed in the functional area 20.

Specifically, with reference to FIG. 3, the bottom layer 101 may be disposed in both the programmable area 10 and the functional area 20. The buried insulating layer 103 may be disposed in both the programmable area 10 and the functional area 20. The buried insulating layer 103 may be disposed on the bottom layer 101. The semiconductor fin 105 may be only disposed in the functional area 20 and disposed on the buried insulating layer 103. The semiconductor fin 105 may have a thickness between about 10 nm and about 150 nm. In some embodiments, the semiconductor fin 105 may be single crystalline. The crystal orientation of the semiconductor fin 105 may be <100>, <110>, or <111>. In some embodiments, the semiconductor fin 105 may be formed of, for example, silicon, germanium, silicon germanium, silicon carbide, gallium arsenide, gallium phosphide, indium phosphide, indium arsenide, or indium antimonide.

With reference to FIG. 3, the functional gate structure may include a gate insulating layer 301, a gate work function layer 303, a gate filler layer 305, and gate spacers 307. The gate insulating layer 301 may be disposed on the semiconductor fin 105 and may have a U-shaped cross-sectional profile. The gate insulating layer 301 may have a thickness between about 0.5 nm and about 5.0 nm. The gate insulating layer 301 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or combinations thereof. In some embodiments, the gate insulating layer 301 may be a multilayer structure that includes, for example, one layer of silicon oxide and another layer of high-k dielectric material.

With reference to FIG. 3, the gate work function layer 303 may be disposed on the gate insulating layer 301 and may have a U-shaped cross-sectional profile. The top surfaces of the gate work function layer 303 and the top surfaces of the gate insulating layer 301 may be substantially coplanar. The gate work function layer 303 may be used to tune the threshold voltage of the semiconductor device 1C and may include a material specific to the type of semiconductor device 1C being formed (e.g., n-type work function material for an n-type device, p-type work function material for a p-type device). Exemplary p-type work function metals include titanium nitride, tantalum nitride, ruthenium, molybdenum, aluminum, tungsten nitride, zirconium silicide, molybdenum silicide, tantalum silicide, Nickel silicide, other suitable p-type work function materials, or combinations thereof. Exemplary n-type work function metals include titanium, silver, tantalum aluminum alloy, tantalum aluminum carbide alloy, titanium aluminum nitride, tantalum carbide, tantalum carbon nitride, tantalum silicon nitride, manganese, zirconium, other suitable n-type work function materials, and/or combinations thereof.

With reference to FIG. 3, the gate filler layer 305 may be disposed on the gate work function layer 303. The top surfaces of the gate filler layer 305 and the top surfaces of the gate work function layer 303 may be substantially coplanar. The gate filler layer 305 may be formed of, for example, tungsten, aluminum, copper, titanium, silver, ruthenium, molybdenum, or alloy thereof.

With reference to FIG. 3, the gate spacers 307 may be disposed on two sides of the gate insulating layer 301 and on the semiconductor fin 105. The top surfaces of the gate spacers 307 may be substantially coplanar with the top surfaces of the gate insulating layer 301. The gate spacers 307 may be formed of, for example, semiconductor oxides, semiconductor nitrides, semiconductor oxynitrides, semiconductor carbides, or other dielectrics. In some examples, the gate spacers 307 may include alternating layers of different dielectrics such as a first semiconductor oxide spacer and a second semiconductor nitride spacer.

With reference to FIG. 3, the impurity regions 107 may be disposed on the semiconductor fin 105. The impurity regions 107 may be respectively correspondingly disposed on the lower portions of the sides of the gate spacers 307. The impurity regions 107 may be formed of a same material as the semiconductor fin 105 and may doped with dopant such as phosphorus, arsenic, antimony, or boron. The impurity regions 107 may have same crystalline characteristics as the semiconductor fin 105.

With reference to FIG. 3, the first insulating layer 201, the first spacers 207, the first conductive blocks 209, the first work function layer 211, and the first filler layer 213 may be only disposed in the programmable area 10. The first insulating layer 201 may be disposed on the buried insulating layer 103. The first insulating layer 201 may include a peak portion 203 and upper portions 205. The peak portion 203 may have a V-shaped cross-sectional profile. The bottommost point 201P (or vertex) of the peak portion 203 may extend to the upper portion of the buried insulating layer 103. In some embodiments, the bottommost points 201BP of the first insulating layer 201 may be at a same vertical level as the top surface 103TS of the buried insulating layer 103. Each of the upper portions 205 may have line shape cross-sectional profile. The upper portions 205 may be respectively correspondingly disposed on two ends of the peak portion 203. The top surfaces of the first insulating layer 201 may be substantially coplanar with the top surfaces of the gate insulating layer 301. The first insulating layer 201 may have a same thickness as the gate insulating layer 301 and may be formed of a same material as the gate insulating layer 301. The fabrication of the first insulating layer 201 may integrate into the fabrication of the gate insulating layer 301.

With reference to FIG. 3, the first work function layer 211 may be disposed on the first insulating layer 201. The first work function layer 211 may have a similar cross-sectional profile as the first insulating layer 201. The top surfaces of the first work function layer 211 may be substantially coplanar with the top surfaces of the gate work function layer 303. The bottommost point 211BP of the first work function layer 211 may be at a vertical level above the top surface 103TS of the buried insulating layer 103. The first work function layer 211 may be formed of a same material as the gate work function layer 303. The fabrication of the first work function layer 211 may integrate into the fabrication of the gate work function layer 303.

With reference to FIG. 3, the first filler layer 213 may be disposed on the first work function layer 211. The top surface of the first filler layer 213 may be substantially coplanar with the top surface of the gate filler layer 305. The first filler layer 213 may be formed of a same material as the gate filler layer 305. The fabrication of the first filler layer 213 may integrate into the fabrication of the gate filler layer 305.

With reference to FIG. 3, the top insulating layer 109 may be disposed in both the programmable area 10 and the functional area 20. In the programmable area 10, the top insulating layer 109 may be disposed on the sides of the first spacers 207. In the functional area 20, the top insulating layer 109 may be disposed on the sides of the gate spacers 307 and on the impurity regions 107. The top surface of the top insulating layer 109 may be substantially coplanar with the top surfaces of the first insulating layer 201.

With reference to FIG. 3, the first conductive blocks 209 may be disposed on the buried insulating layer 103 and on the two sides of the first insulating layer 201. The first conductive blocks 209 may be spaced apart by the first insulating layer 201 and the first spacers 207. Specifically, the lower portions of the first conductive blocks 209 may be disposed on the two sides 203S of the peak portion 203. The peak portion 203 may separate the first conductive blocks 209. The middle portions of the first conductive blocks 209 may be disposed on the lower portions of the sides of the first spacers 207. The upper portions of the first conductive blocks 209 may be respectively correspondingly disposed penetrating the top insulating layer 109. The top surfaces of the first conductive blocks 209 may be substantially coplanar with the top surfaces of the first insulating layer 201. The bottom surfaces of the first conductive blocks 209 may be substantially coplanar with the top surface 103TS of the buried insulating layer 103.

The first insulating layer 201 and the first conductive blocks 209 together form a programmable feature such as an anti-fuse. An anti-fuse starts with a high resistance and is designed to permanently create an electrically conductive path.

With reference to FIG. 3, the first contacts 309 may be disposed in the functional area 20 and disposed penetrating the top insulating layer 109. The first contacts 309 may be respectively correspondingly disposed on the impurity regions 107 and may be electrically connected to the impurity regions 107. The first contacts 309 may be formed of, for example, tungsten, copper, cobalt, ruthenium, or molybdenum. In some embodiments, the sidewalls of the first contacts 309 may have a slanted cross-sectional profile. In some embodiments, widths of the first contacts 309 may gradually become wider from bottom to top along the direction Z.

In the semiconductor device 1C, the gate insulating layer 301 and the first insulating layer 201 may be concurrently fabricated, the gate work function layer 303 and the first work function layer 211 may be concurrently fabricated, the gate filler layer 305 and the first filler layer 213 may be concurrently fabricated, and the first spacers 207 and the gate spacers 307 may be concurrently fabricated. Hence, the complexity of fabrication of the semiconductor device 1C may be reduced. Accordingly, the cost of fabrication of the semiconductor device 1C may be reduced.

The programming of the semiconductor device 1C may be operate with a procedure similar to that illustrated in semiconductor device 1A.

With reference to FIG. 4, in the semiconductor device 1D, only one first conductive layer 209 is disposed on one side of the first insulating layer 201. The semiconductor fin 105 may be also disposed in the programmable area 10 and disposed on the other side of the peak portion 203. The impurity regions 107 may be also disposed in the programmable area 10 and disposed on the lower portion of the first spacer 207. The first insulating layer 201, the first conductive blocks 209, the first work function layer 211, and the first filler layer 213 may together form a programmable feature such as an anti-fuse.

Comparing to programming the semiconductor device 1A or the semiconductor device 1C, a programming voltage may be provided and applied to the semiconductor device 1D through the first conductive layer 209 and the first filler layer 213 during programming of the semiconductor device 1D.

In the semiconductor device 1D, the semiconductor fin 105 and the impurity regions 107 disposed in the programmable area 10 may provide additional mechanical support to the programmable feature. Therefore, the structural stability of the semiconductor device 1D may be improved.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

Figure 5:
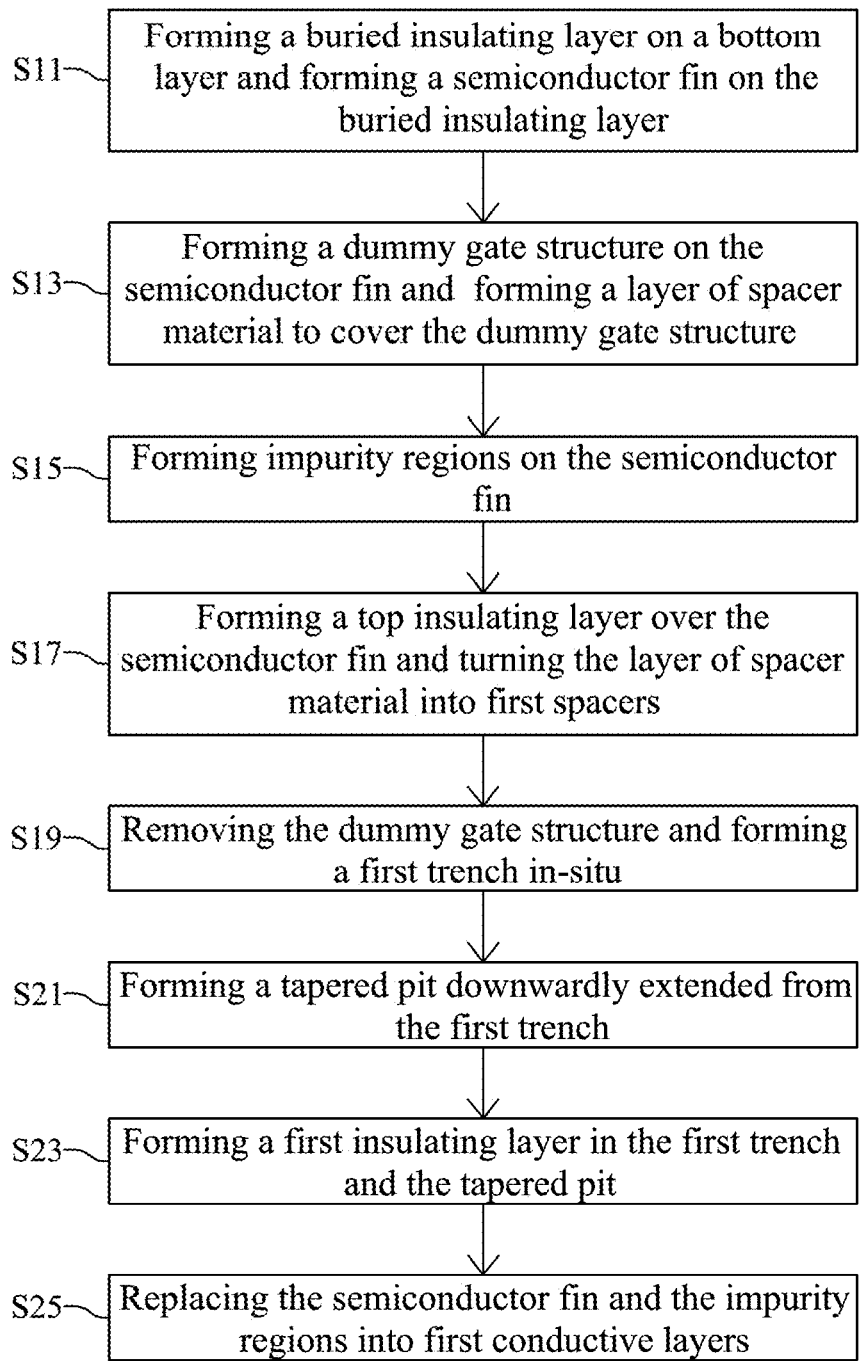
FIG. 5 illustrates, in a flowchart diagram form, a method for fabricating a semiconductor device in accordance with one embodiment of the present disclosure.

FIG. 5 illustrates, in a flowchart diagram form, a method 30 for fabricating a semiconductor device 1B in accordance with one embodiment of the present disclosure. FIGS. 6 to 16 illustrate, in schematic cross-sectional view diagrams, a flow for fabricating the semiconductor device 1B in accordance with one embodiment of the present disclosure.

Figure 6:
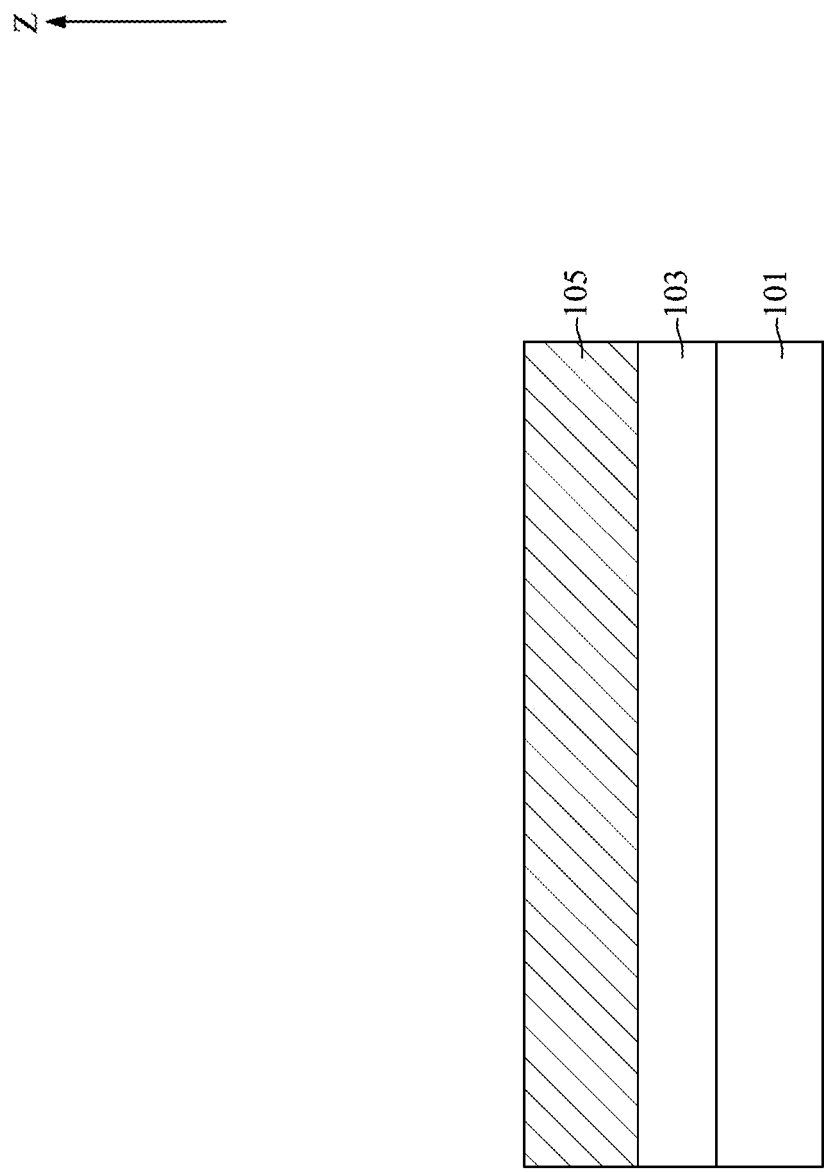
FIGS. 6 to 16 illustrate, in schematic cross-sectional view diagrams, a flow for fabricating the semiconductor device in accordance with one embodiment of the present disclosure.

With reference to FIGS. 5 and 6, at step S11, a buried insulating layer 103 may be formed on a bottom layer 101, and a semiconductor fin 105 may be formed on the buried insulating layer 103.

With reference to FIG. 6, a top layer (not shown), which may be subsequently processed into the semiconductor fin 105, may be formed on the buried insulating layer 103. In some embodiments, the bottom layer 101, the buried insulating layer 103, and the top layer (abbreviate as semiconductor-on-insulator) may be formed by wafer bonding. In some embodiments, the semiconductor-on-insulator may be formed by a process like separation by implantation of oxygen. In some embodiments, a thermal mixing process or a thermal condensation process may be employed in forming the top layer. Thermal mixing includes annealing in an inert ambient (i.e., helium and/or argon), while thermal condensation includes annealing in an oxidizing ambient (air, oxygen, ozone and/or $NO_2$). The anneal temperature for both thermal mixing and thermal condensation can be from about 600 degree to about 1200 degree.

The semiconductor fin 105 may be formed on the buried insulating layer 103 by recessing surrounding portions of the top layer and leaving the semiconductor fin 105. The recessing of the top layer may be achieved by self-aligned double patterning/self-aligned quadruple patterning and subsequent etch process. Examples of etch process that can used to transfer the pattern may include dry etching (i.e., reactive ion etching, plasma etching, and ion beam etching or laser ablation) or a chemical wet etch process.

Figure 7:
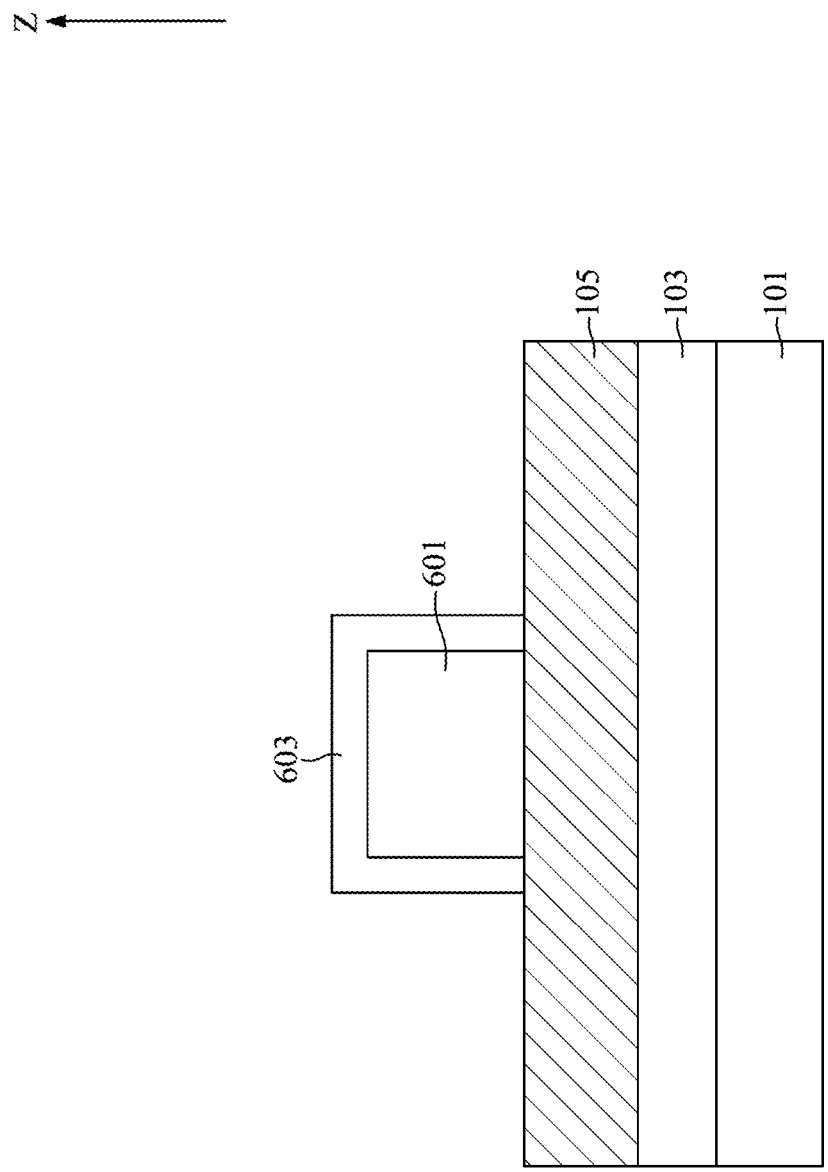

With reference to FIGS. 5 and 7, at step S13, a dummy gate structure 601 may be formed on the semiconductor fin 105, and a layer of spacer material 603 may be formed to cover the dummy gate structure 601.

With reference to FIG. 7, the dummy gate structure 601 may include a dummy gate bottom layer (not individually shown) and a dummy gate mask layer (not individually shown). The dummy gate bottom layer may be formed on the semiconductor fin 105. The dummy gate bottom layer may be formed of, for example, polysilicon, amorphous silicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The dummy gate mask layer may be formed on the dummy gate bottom layer. The dummy gate mask layer may be formed of, for example, silicon nitride, silicon oxynitride, silicon nitride oxide, aluminum oxide, or zirconium oxide. The dummy gate structure 601 may have a height between about 50 nm and about 200 nm. The layer of spacer material 603 may be formed of, for example, semiconductor oxides, semiconductor nitrides, semiconductor oxynitrides, semiconductor carbides, or other dielectrics.

Figure 8:
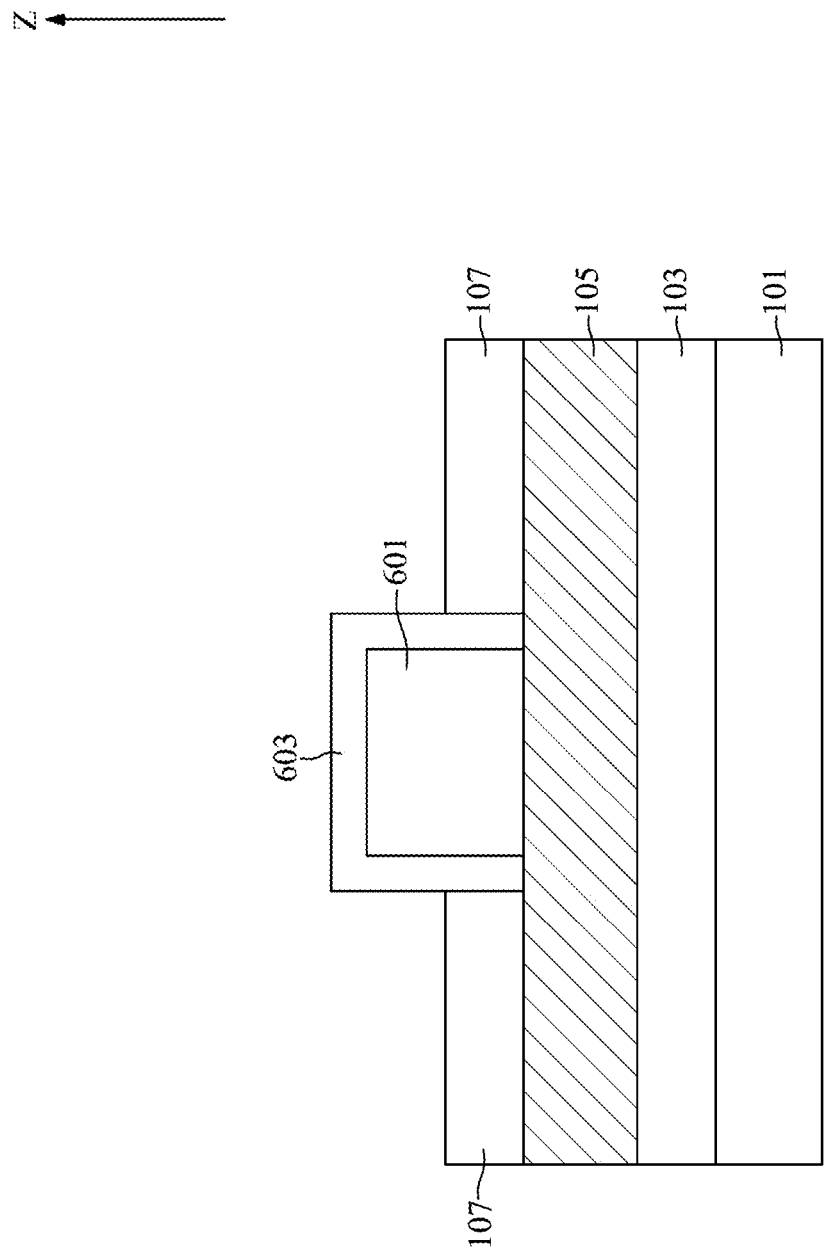

With reference to FIGS. 5 and 8, at step S15, impurity regions 107 may be formed on the semiconductor fin 105.

With reference to FIG. 8, the impurity regions 107 may be formed on two sides of the dummy gate structure 601. The impurity regions 107 may be formed by an epitaxial growth process. The impurity regions 107 may be in-situ doped during the epitaxial growth process or may be doped with an implantation process after the epitaxial growth process. The impurity regions 107 may include silicon and dopants such as phosphorus, arsenic, antimony, boron, or indium. The impurity regions 107 may have a dopant concentration between about 1E19 atoms/cm$^3$ and about 5E21 atoms/cm$^3$. An annealing process may be performed to activate the impurity regions 107. The annealing process may have a process temperature between about 800 degree and about 1250 degree. The annealing process may have a process duration between about 1 millisecond and about 500 milliseconds. The annealing process may be, for example, a rapid thermal anneal, a laser spike anneal, or a flash lamp anneal.

Figure 9:
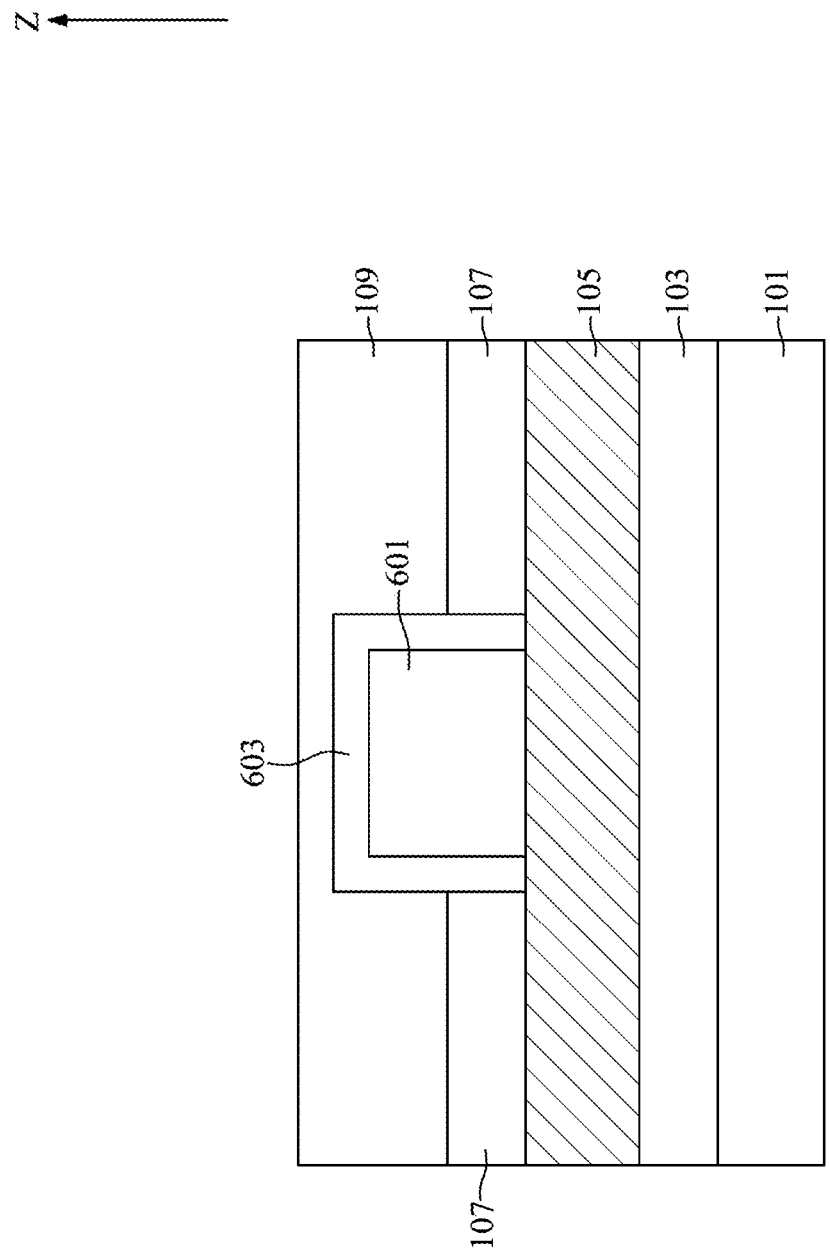
Figure 10:
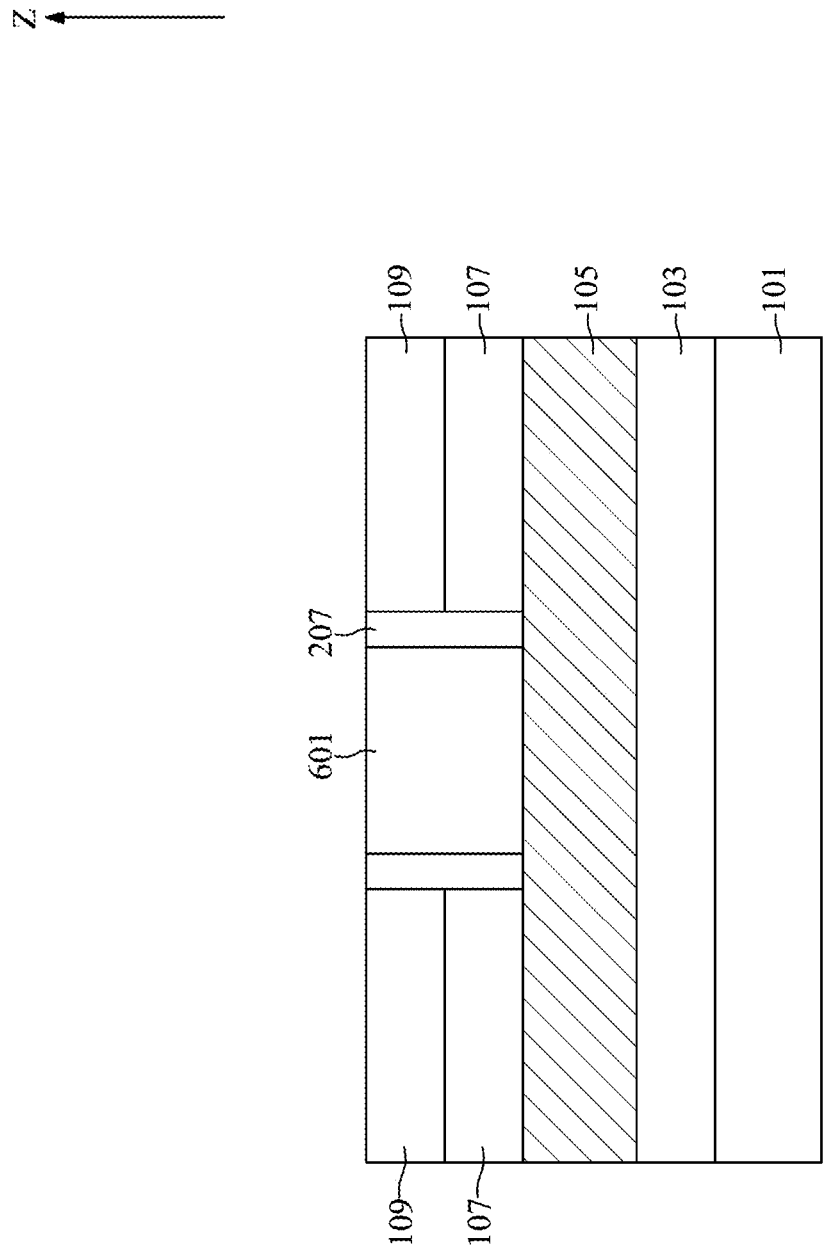

With reference to FIGS. 5, 9, and 10, at step S17, a top insulating layer 109 may be formed over the semiconductor fin 105, and the layer of spacer material 603 may be turned into first spacers 207.

With reference to FIG. 9, the top insulating layer 109 may be formed over the semiconductor fin 105 and the impurity regions 107, and covering the dummy gate structure 601 and the layer of spacer material 603.

With reference to FIG. 10, a planarization process, such as chemical mechanical polishing, may be performed until a top surface of the dummy gate structure 601 is exposed to remove excess material and provide a substantially flat surface for subsequent processing steps. After the planarization process, the layer of spacer material 603 may be turned into the first spacers 207 on the two sides of the dummy gate structure 601.

Figure 11:
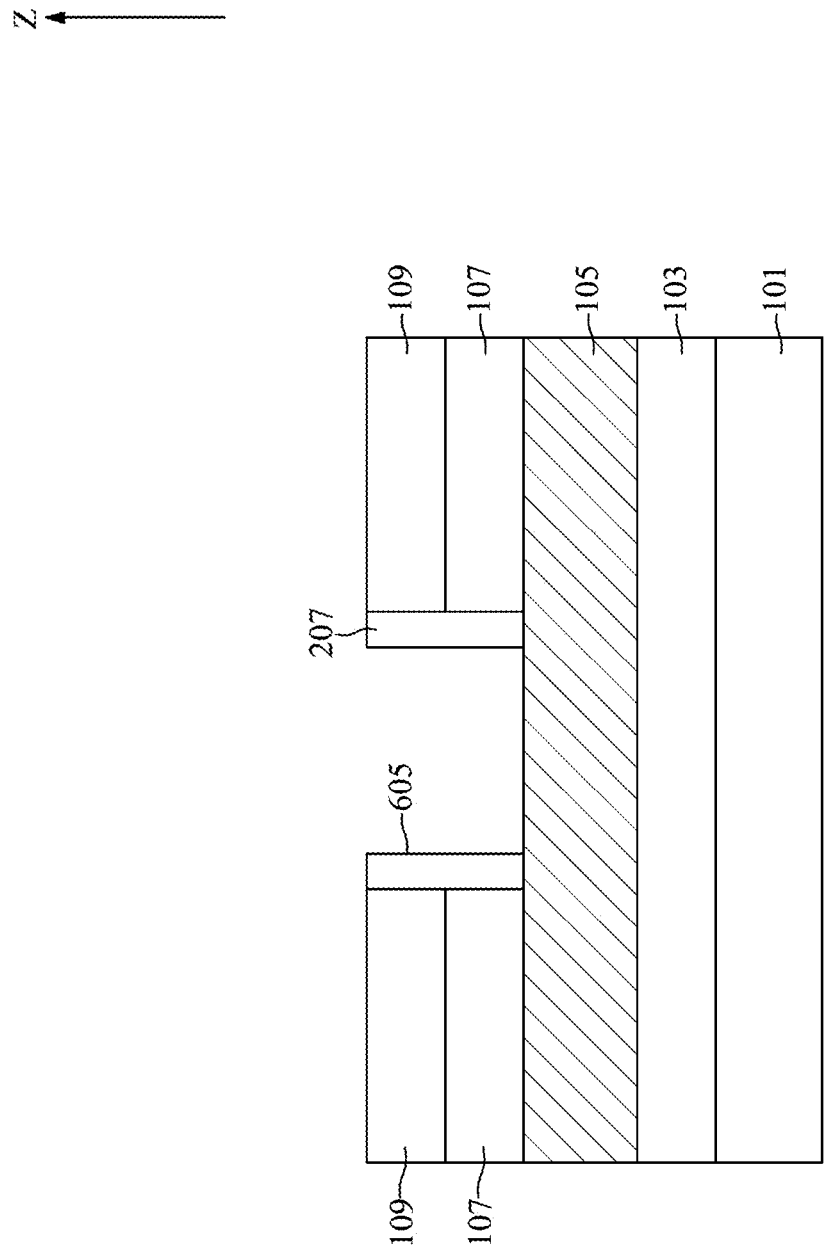

With reference to FIGS. 5 and 11, at step S19, the dummy gate structure 601 may be removed and a first trench 605 may be concurrently formed in-situ.

With reference to FIG. 11, the dummy gate structure 601 may be removed by a multi-step etching process. After the removal of the dummy gate structure 601, a first trench 605 may be formed in situ; in other words, the first trench 605 may be formed in the place previously occupied by the dummy gate structure 601.

Figure 12:
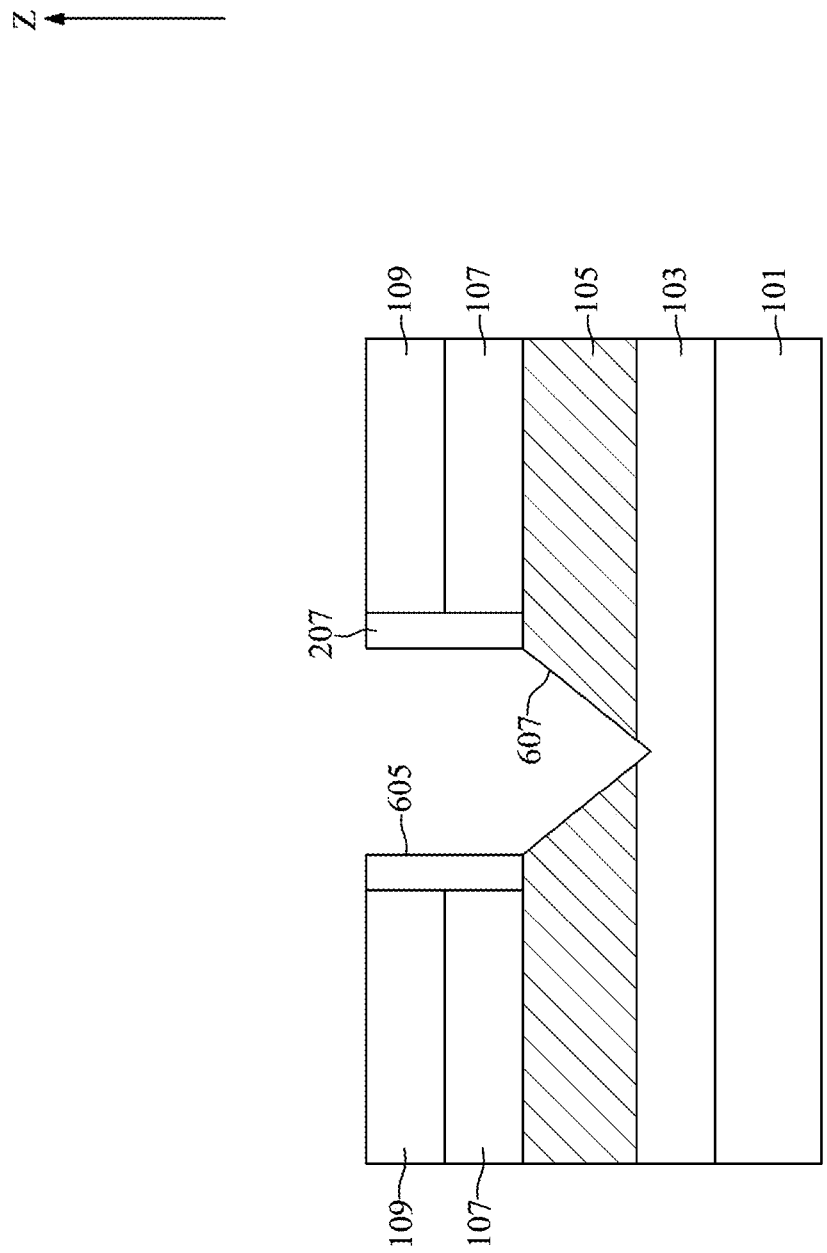

With reference to FIGS. 5 and 12, at step S21, a tapered pit 607 may be formed downwardly extended from the first trench 605.

With reference to FIG. 12, a first etch process may be performed using an alkaline aqueous based etchant in the first trench 605 to remove portions of the semiconductor fin 105. The alkaline aqueous based etchant may have an etching selectivity to crystal orientation <100> plane. The alkaline aqueous based etchant may include potassium hydroxide, sodium hydroxide, lithium hydroxide, cesium hydroxide, rubidium hydroxide, ammonium hydroxide, or tetramethylammonium hydroxide. After the first etch process, the tapered pit 607 may be formed in the semiconductor fin 105 and may separate the semiconductor fin 105 into two parts (left part and right part for the present embodiment). The sidewalls of the tapered pit 607 may have a crystal orientation <111>. The bottom of the tapered pit 607 may be at a same vertical level as the top surface of the buried insulating layer 103. A second etch process may be performed to remove a portion of the buried insulating layer 103. The tapered pit 607 may extend to the upper portion of the buried insulating layer 103 after the second etch process.

Figure 13:
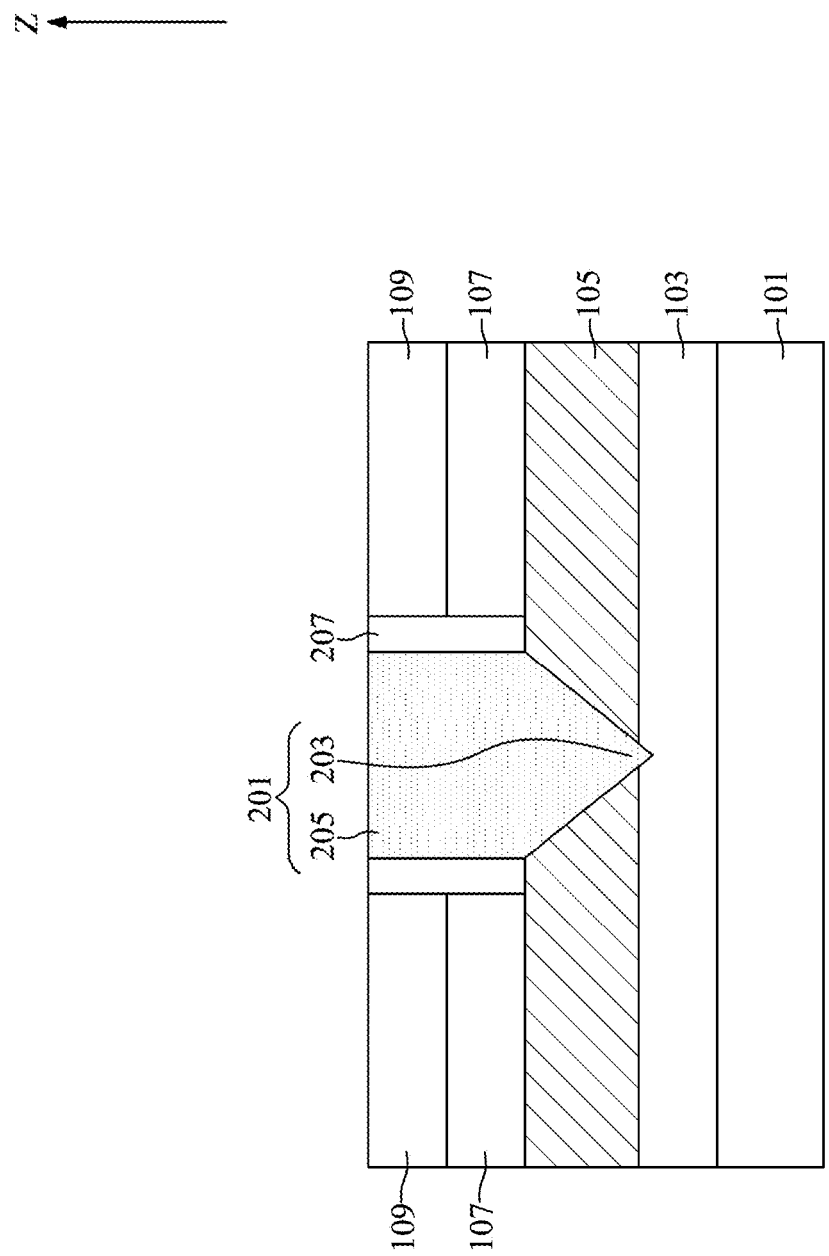

With reference to FIGS. 5 and 13, at step S23, a first insulating layer 201 may be formed in the first trench 605 and the tapered pit 607.

With reference to FIG. 13, a layer of insulating material may be deposited to fill the first trench 605 and the tapered pit 607 and cover the top insulating layer 109. The layer of insulating material may be a high-k dielectric material. A planarization process, such as chemical mechanical polishing, may be performed until the top surface of the top insulating layer 109 is exposed to remove excess material, provide a substantially flat surface for subsequent processing steps, and concurrently form the first insulating layer 201. A portion of the first insulating layer 201 formed in the first trench 605 and between the first spacers 207 may be referred to as the upper portion 205 of the first insulating layer 201. A portion of the first insulating layer 201 formed in the tapered pit 607 may be referred to as the peak portion 203 of the first insulating layer 201.

With reference to FIG. 5 and FIGS. 14 to 16, at step S25, the semiconductor fin 105 and the impurity regions 107 may be replaced with first conductive blocks 209.

Figure 14:
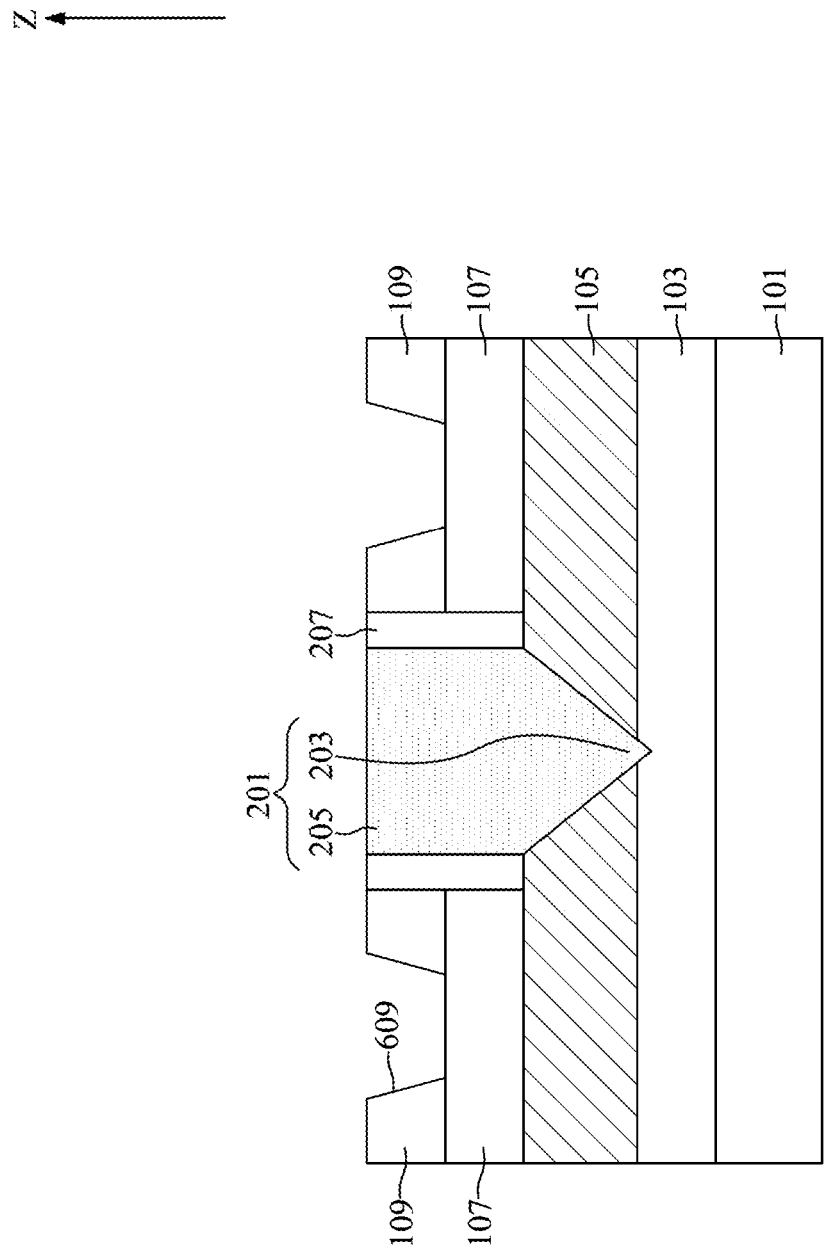

With reference to FIG. 14, contact openings 609 may be formed in the top insulating layer 109. Portions of the impurity regions 107 may be exposed through the contact openings 609. The contact openings 609 may have slanted sidewalls.

Figure 15:
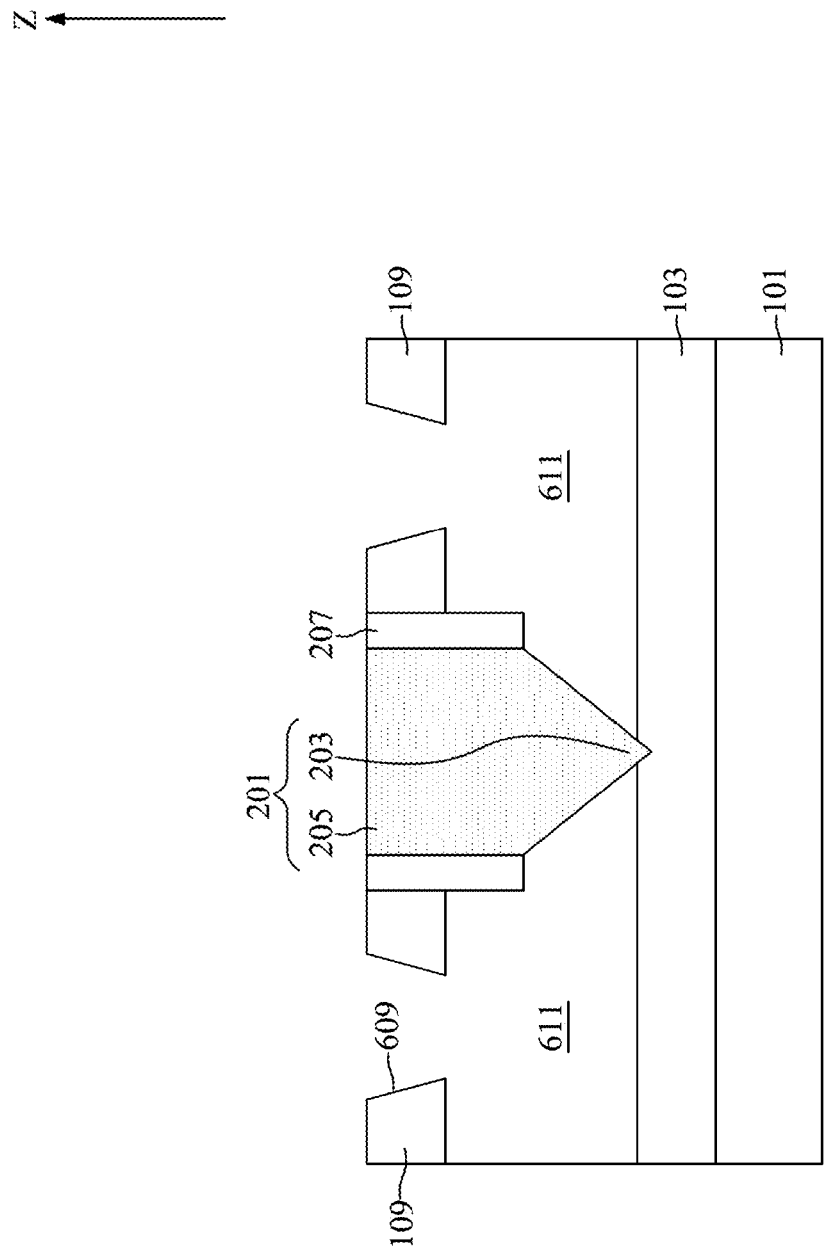

With reference to FIG. 15, the impurity regions 107 and the semiconductor fin 105 may be removed through the contact openings 609 and first voids 611 may be concurrently formed in-situ. In some embodiments, the impurity regions 107 and the semiconductor fin 105 may be removed by hydrochloric acid gas. In some embodiments, the impurity regions 107 and the semiconductor fin 105 may be removed by a wet etchant such as tetramethylammonium hydroxide or ammonia. After the removal of the impurity regions 107 and the semiconductor fin 105, the first voids 611 may be formed in the places previously occupied by the impurity regions 107 and the semiconductor fin 105.

Figure 16:
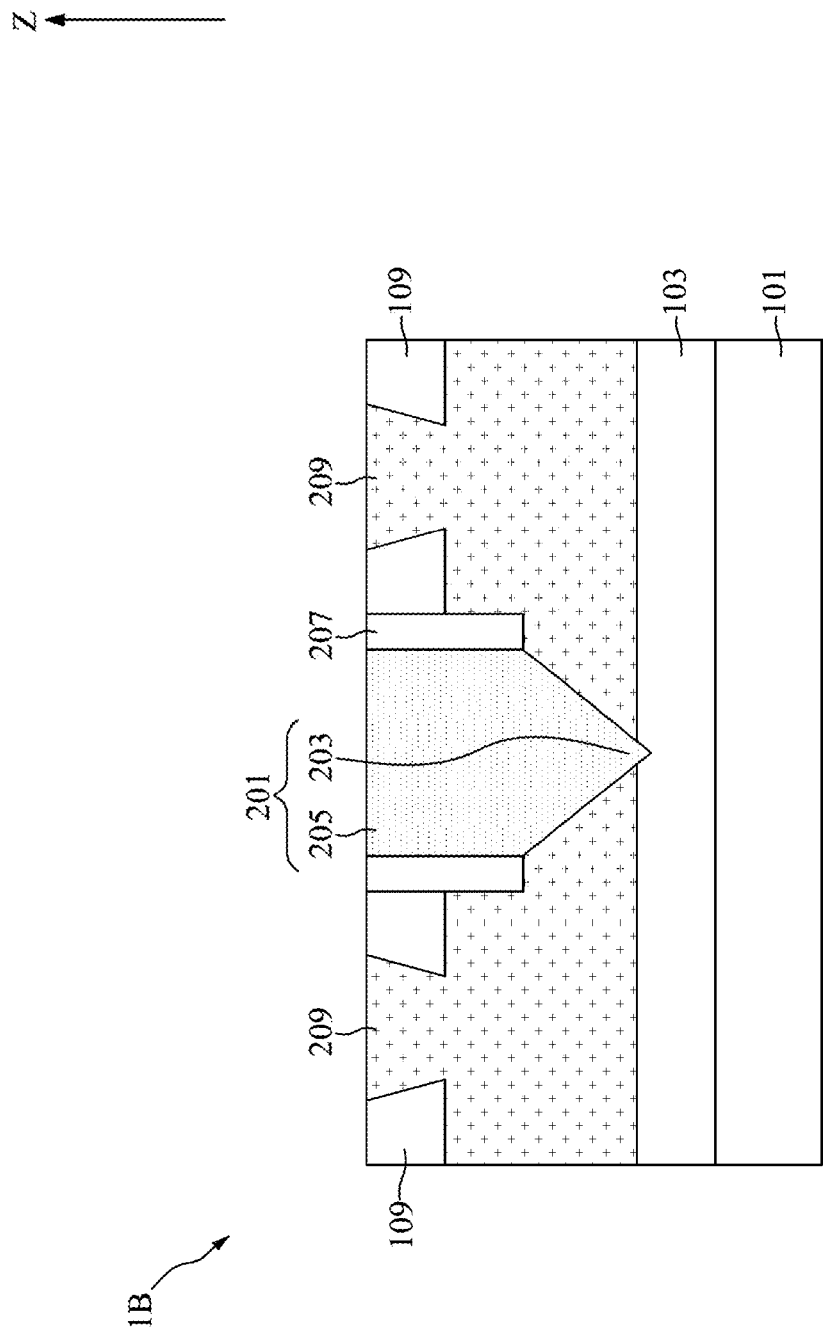

With reference to FIG. 16, a layer of conductive material may be deposited to fill the first voids 611. The conductive material may be, for example, aluminum, copper, titanium, tungsten, cobalt, or alloys thereof. A planarization process, such as chemical mechanical polishing, may be performed until the top surface of the top insulating layer 109 is exposed to remove excess material, provide a substantially flat surface for subsequent processing steps, and concurrently form the first conductive blocks 209.

FIGS. 17 to 26 illustrate, in schematic cross-sectional view diagrams, a flow for fabricating a semiconductor device 1C in accordance with another embodiment of the present disclosure.

Figure 17:
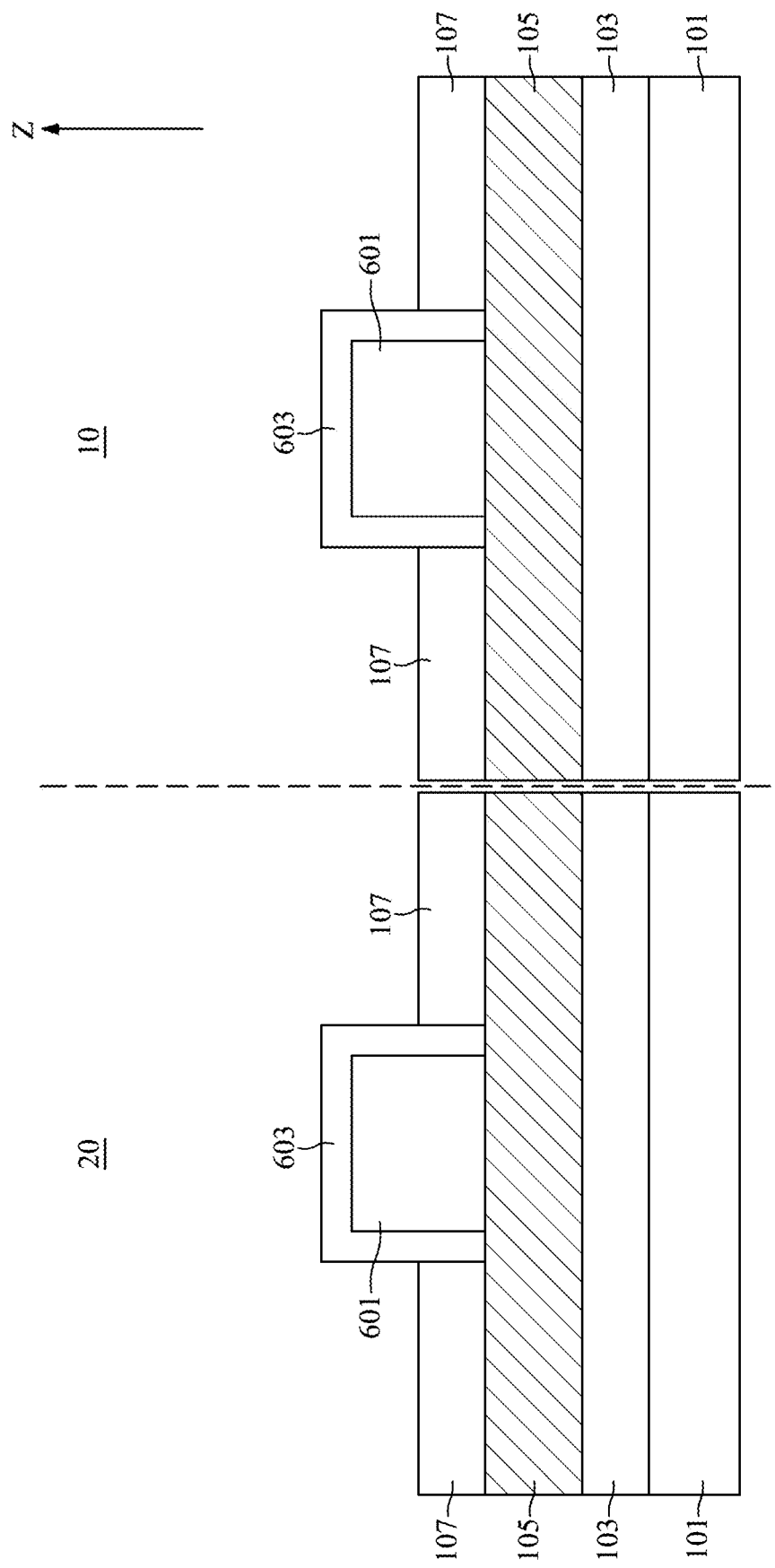
FIGS. 17 to 26 illustrate, in schematic cross-sectional view diagrams, a flow for fabricating a semiconductor device in accordance with another embodiment of the present disclosure.

With reference to FIG. 17, an intermediate semiconductor device as illustrated in FIG. 8 may be concurrently formed in a programmable area 10 and a functional area 20.

Figure 18:
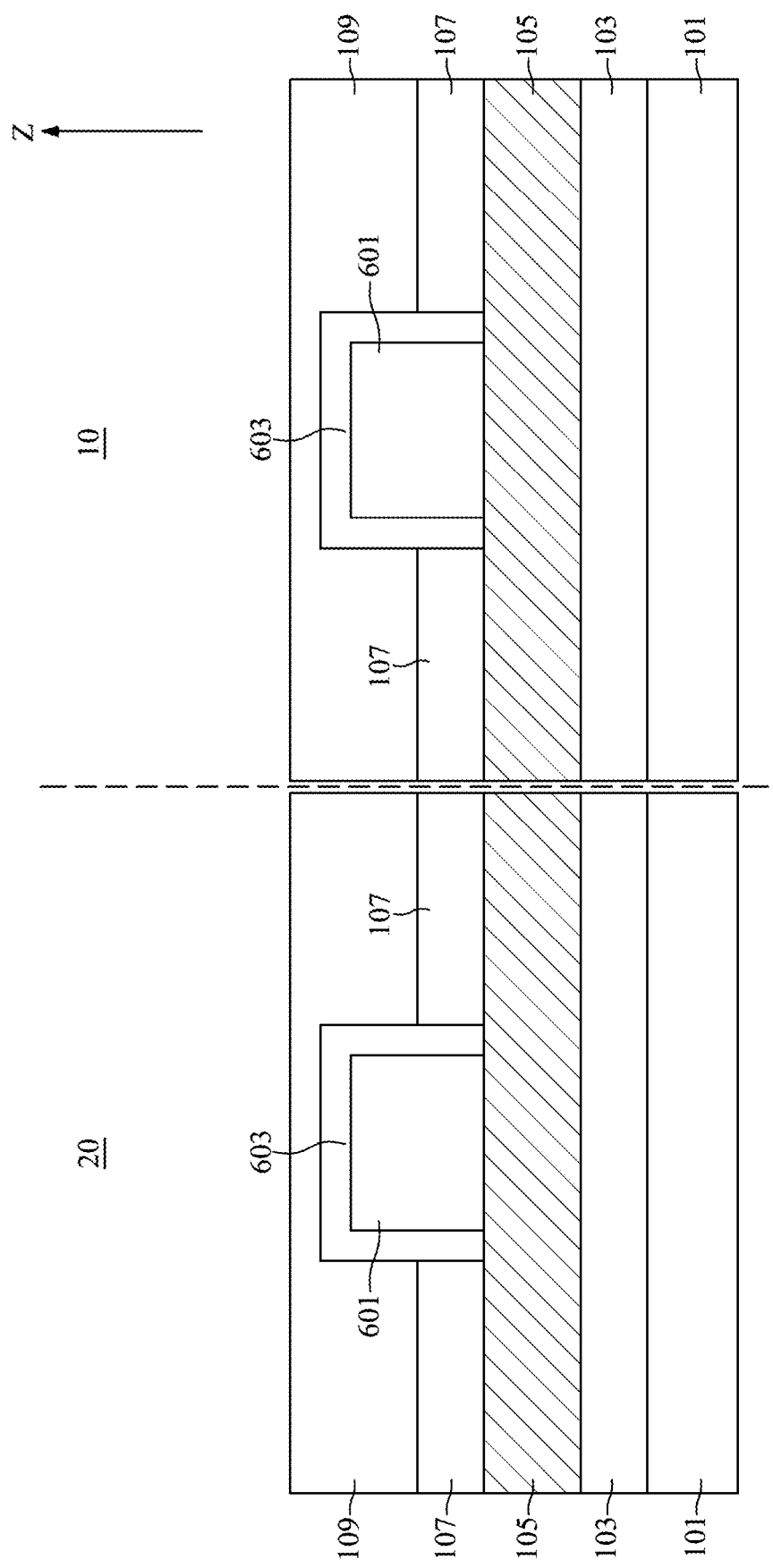
Figure 19:
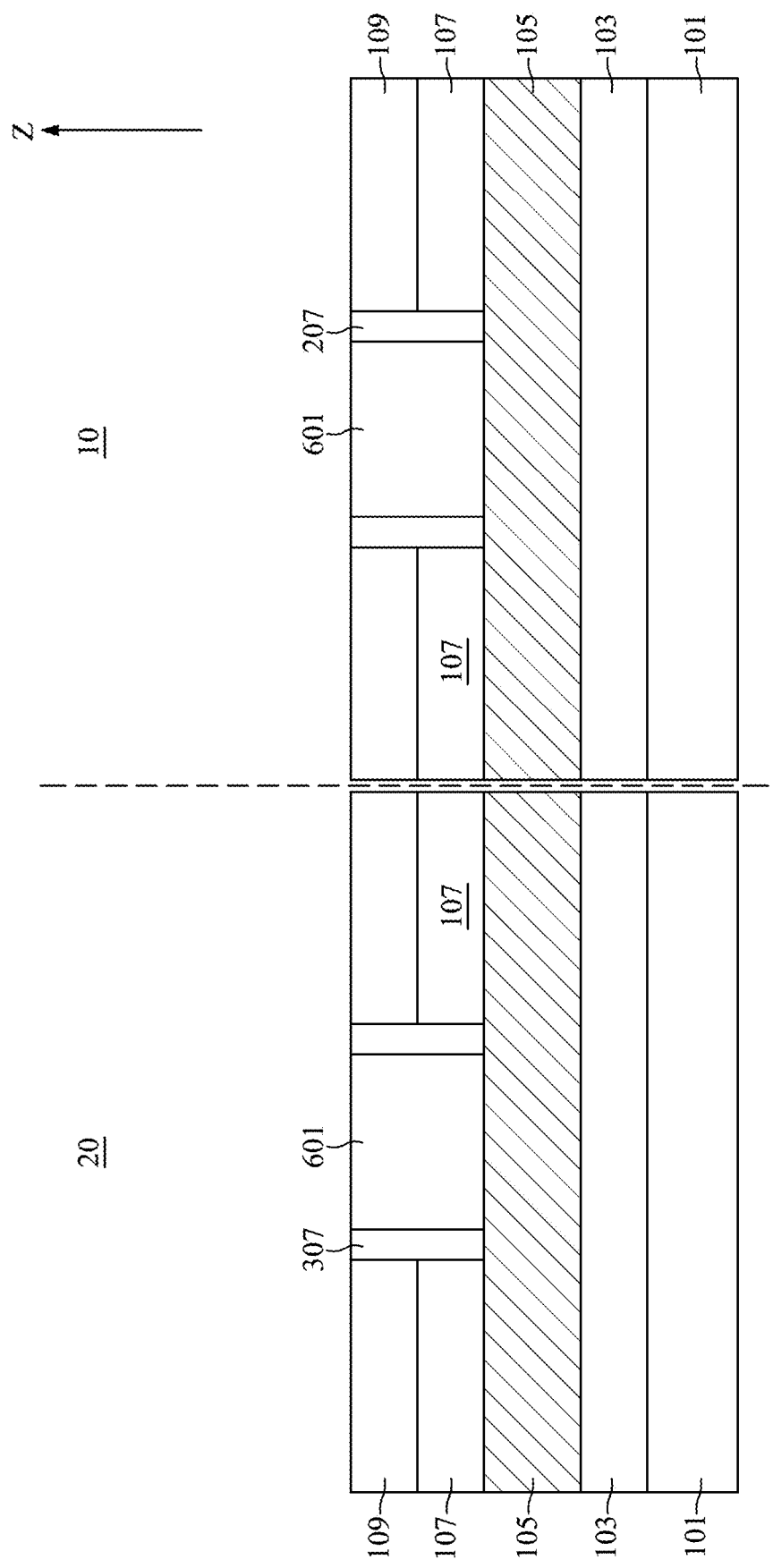

With reference to FIGS. 18 and 19, a procedure similar to that illustrated in FIGS. 9 and 10 may be performed. The layer of spacer material 603 in the programmable area 10 may be turned into the first spacers 207, and the layer of spacer material 603 in the functional area 20 may be turned into the gate spacers 307.

Figure 20:
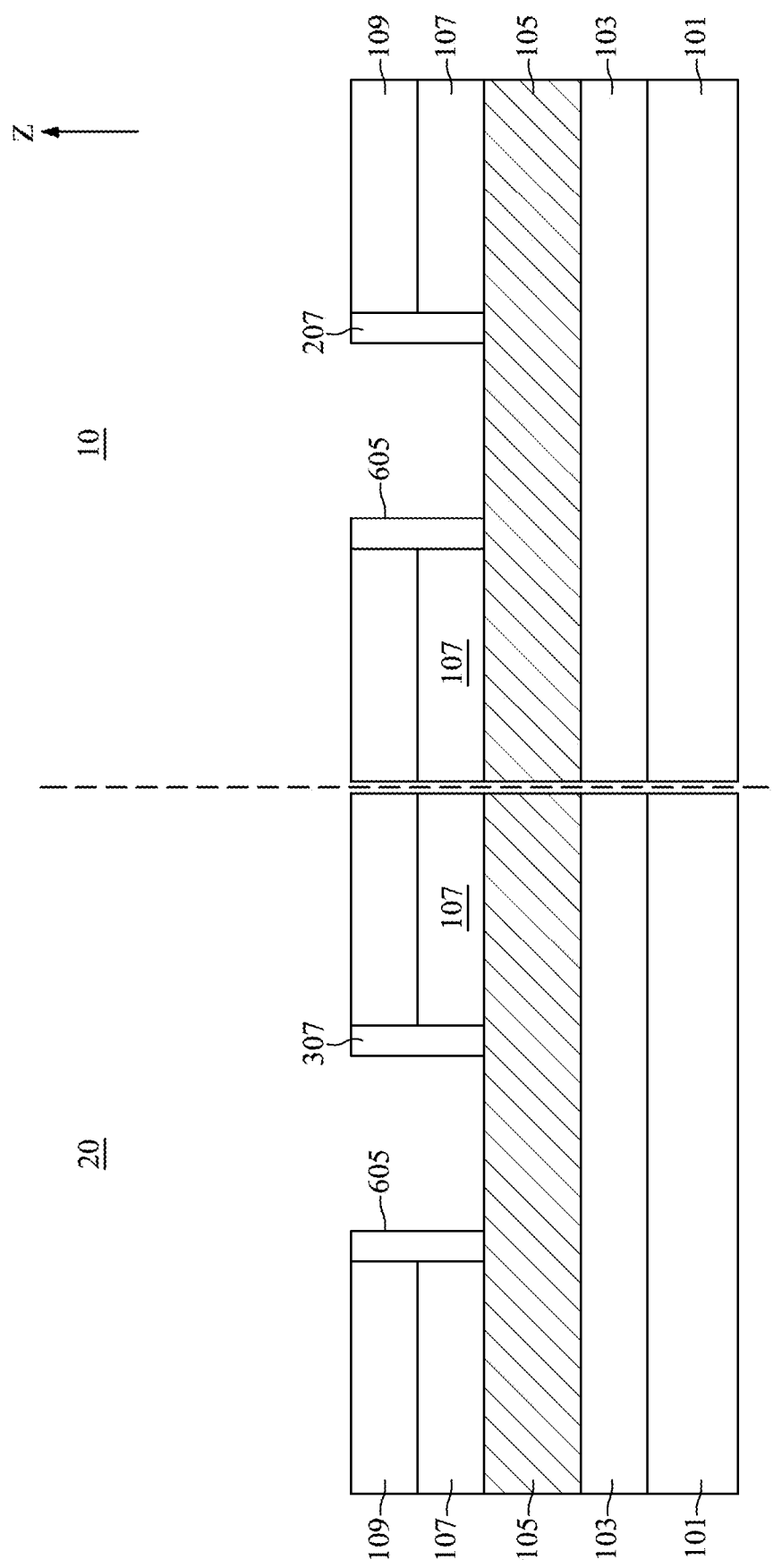

With reference to FIG. 20, a procedure similar to that illustrated in FIG. 11 may be performed, and the first trenches 605 may be formed in both the programmable area 10 and the functional area 20.

Figure 21:
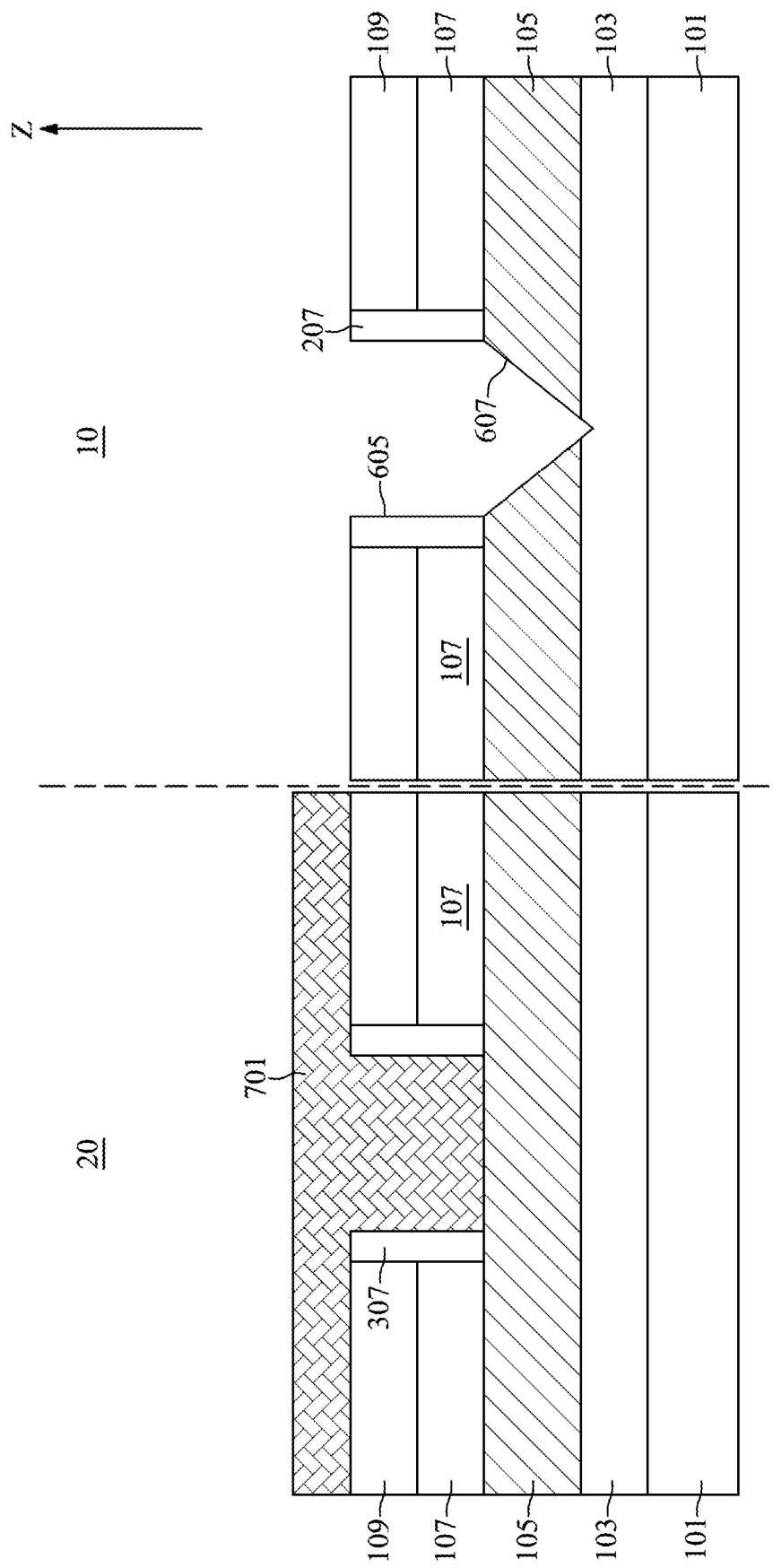

With reference to FIG. 21, a first mask layer 701 may be formed to cover the functional area 20. The first mask layer 701 may be formed of a material having etch resistance to the alkaline aqueous based etchant. Subsequently, a procedure similar to that illustrated in FIG. 11 may be performed to form the tapered pit 607 in the programmable area 10. After the formation of the tapered pit 607, the first mask layer 701 may be removed.

Figure 22:
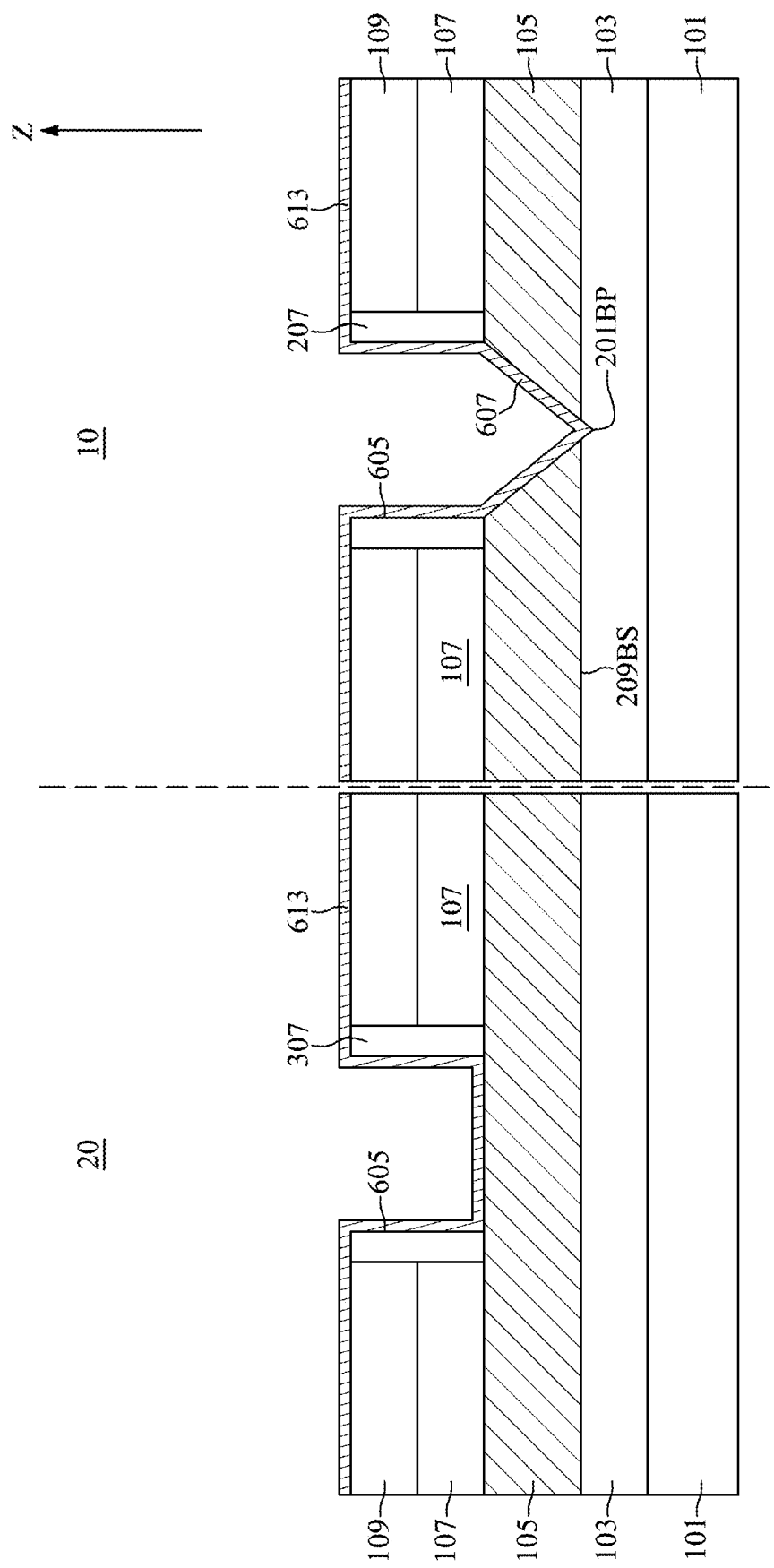

With reference to FIG. 22, a layer of insulating material 613 may be conformally formed in the first trenches 605 and the tapered pit 607 and covering the top surface of the top insulating layer 109. The insulating material 613 may be, for example, a high-k dielectric material. The layer of insulating material 613 may have a thickness between about 0.5 nm and about 5.0 nm.

Figure 23:
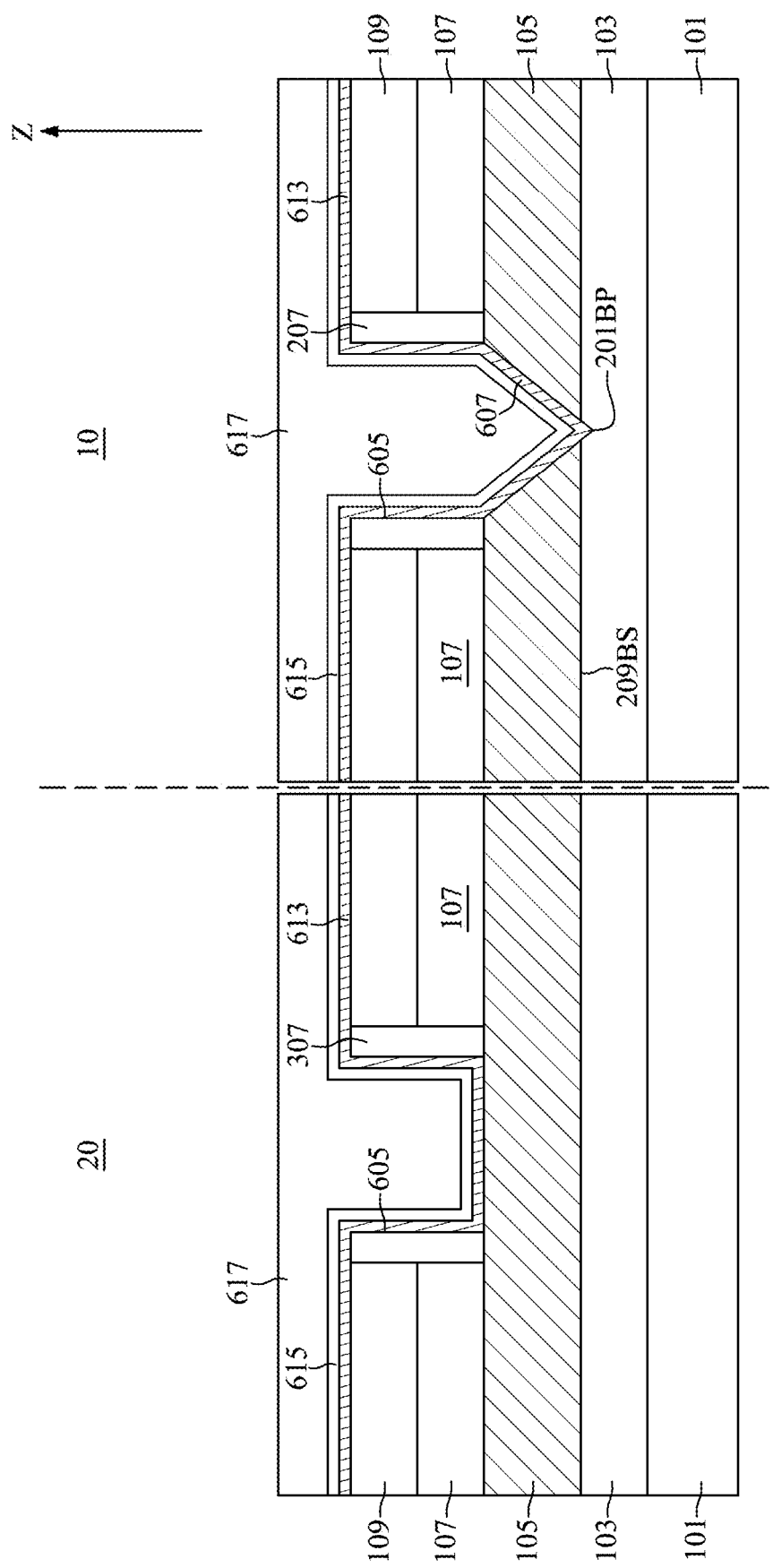

With reference to FIG. 23, a layer of work function material 615 may be conformally formed on the layer of insulating material 613. The layer of conductive material 617 may be formed on the layer of work function material 615 and may completely fill the first trenches 605 and the tapered pit 607. The work function material 615 may be p-type work function metals or n-type work function metals. The conductive material 617 may be tungsten, aluminum, copper, titanium, silver, ruthenium, molybdenum, or alloy thereof.

Figure 24:
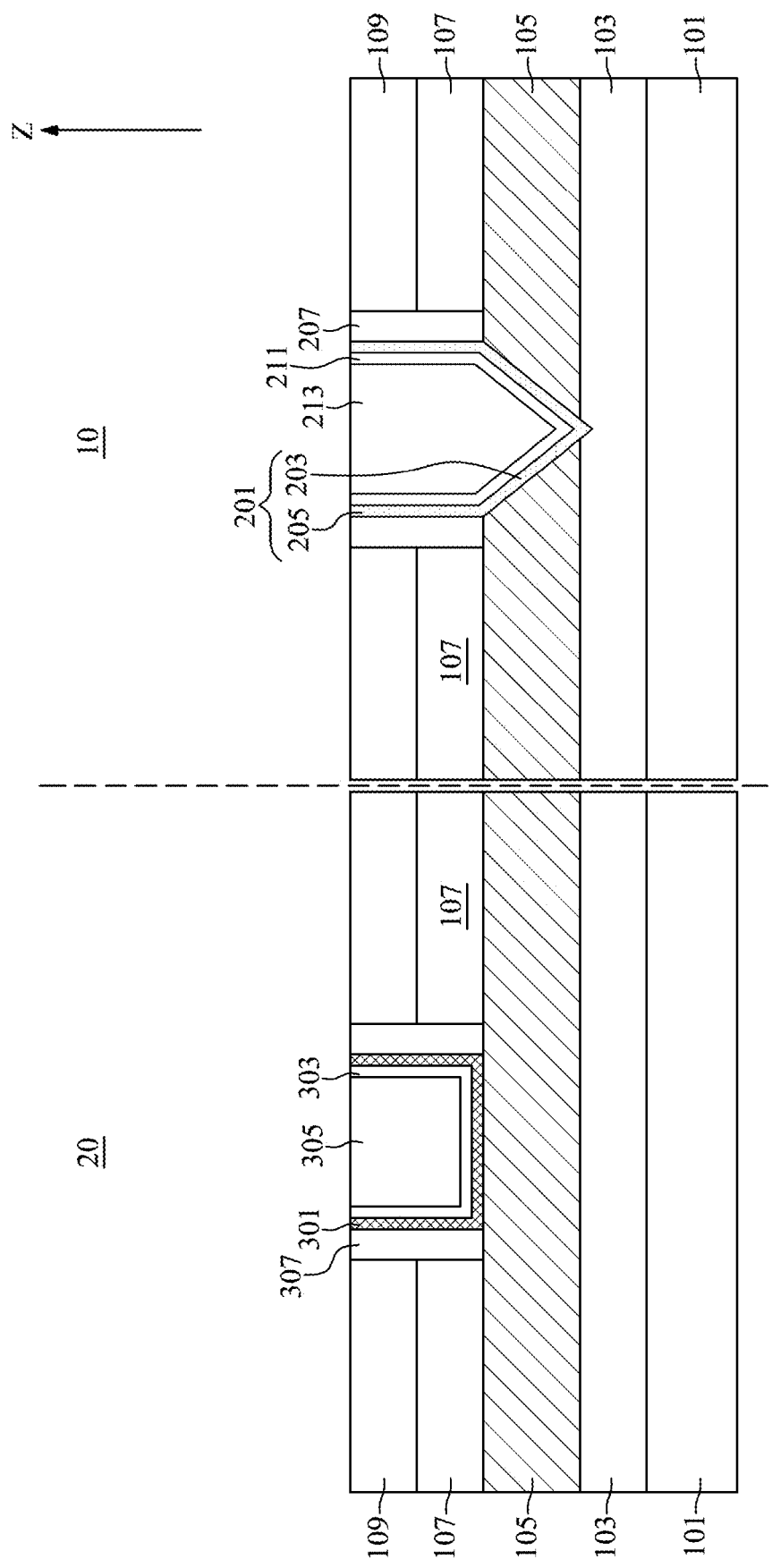

With reference to FIG. 24, a planarization process, such as chemical mechanical polishing, may be performed until the top surface of the top insulating layer 109 is exposed to remove excess material and provide a substantially flat surface for subsequent processing steps. After the planarization process, the layer of insulating material 613 may be respectively turned into the gate insulating layer 301 and the first insulating layer 201, the layer of work function material 615 may be respectively turned into the gate work function layer 303 and the first work function layer 211, and the layer of conductive material 617 may be respectively turned into the gate filler layer 305 and the first filler layer 213.

Figure 25:
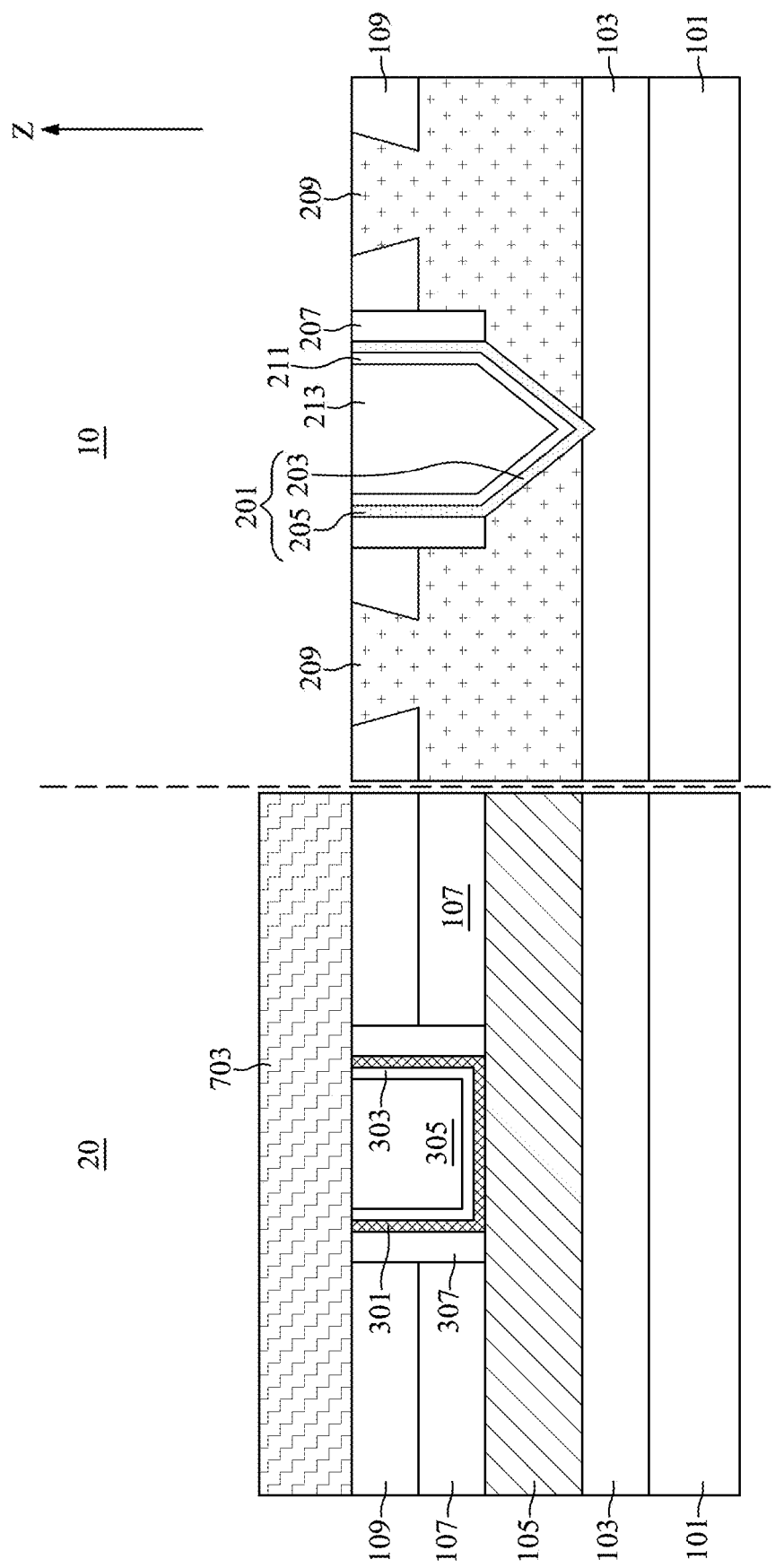

With reference to FIG. 25, a second mask layer 703 may be formed to cover the functional area 20. A procedure similar to that illustrated in FIGS. 14 to 16 may be performed to replace the impurity regions 107 in the programmable area 10 and the semiconductor fin 105 in the programmable area 10 into the first conductive blocks 209. In some embodiments, the second mask layer 703 may be, for example, a photoresist layer. In some embodiments, the second mask layer 703 may be formed of, for example, silicon oxide or silicon nitride. In some embodiments, the second mask layer 703 may be, for example, silicon, germanium, silicon germanium. In some embodiments, the second mask layer 703 may be, for example, aluminum, copper, or tungsten. After formation of the first conductive blocks 209, the second mask layer 703 may be removed.

Figure 26:
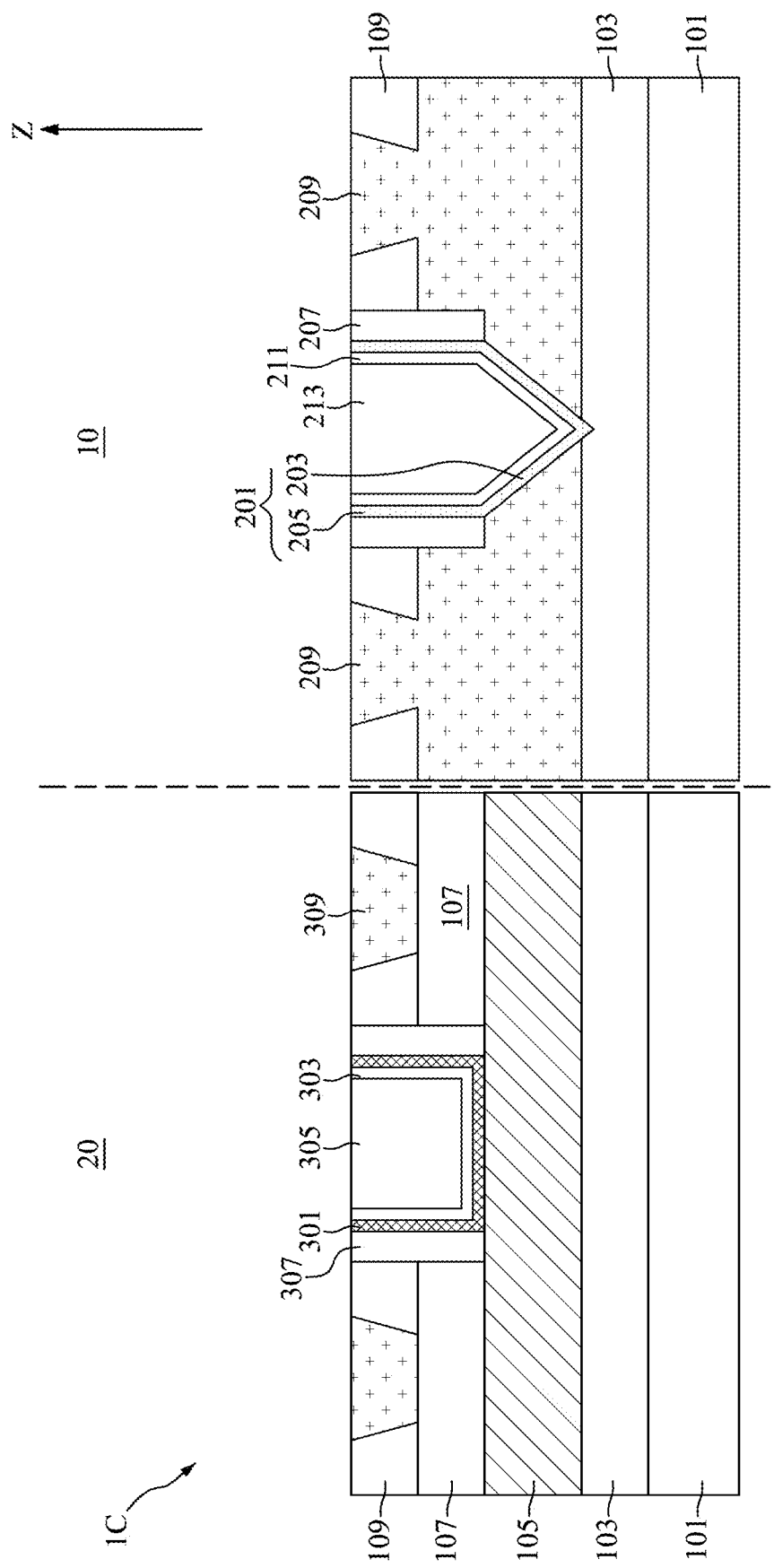

With reference to FIG. 26, first contacts 309 may be formed in the functional area 20, in the top insulating layer 109, and on the impurity regions 107. In some embodiments, the first contacts 309 may be formed during the formation of the first conductive blocks 209.

One aspect of the present disclosure provides a semiconductor device including a first insulating layer including a peak portion and an upper portion positioned on the peak portion, and first conductive blocks positioned on two sides of the peak portion. A width of the peak portion is gradually decreased toward a direction opposite to the upper portion, and the first conductive blocks are spaced apart by the peak portion.

Another aspect of the present disclosure provides a semiconductor device including a first insulating layer including a peak portion having a V-shaped cross-sectional profile and upper portions positioned on two ends of the peak portion, and first conductive blocks positioned on two sides of the peak portion. The first conductive blocks are spaced apart by the peak portion.

Another aspect of the present disclosure provides a method for fabricating a semiconductor device including forming a semiconductor fin on a buried insulating layer, forming a dummy gate structure on the semiconductor fin, forming a top insulating layer over the semiconductor fin and covering the dummy gate structure, removing the dummy gate structure and concurrently forming a first trench in the top insulating layer, performing an etch process in the first trench to form a tapered pit separating the semiconductor fin, forming a first insulating layer to completely fill the first trench and the tapered pit, and replacing the semiconductor fin with first conductive blocks.

Due to the design of the semiconductor device of the present disclosure, the position of the rupture point of the first insulating layer 201 may be easily limited in the place adjacent to the vertex of the peak portion 203 having the highest electrical fields during programming. As result, the reliability of programming of the semiconductor device 1A may be increased. In addition, the formation of the first insulating layer 201 may be integrated with the formation of the gate insulating layer 301 to reduce the complexity and cost of fabrication of the semiconductor device 1C.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
a first insulating layer comprising a peak portion and an upper portion positioned on the peak portion;
first conductive blocks positioned on two sides of the peak portion; and
a buried insulating layer positioned below the first conductive blocks, wherein the peak portion is extending to an upper portion of the buried insulating layer;
wherein a width of the peak portion is gradually decreased toward a direction opposite to the upper portion, and the first conductive blocks are spaced apart by the peak portion.

2. The semiconductor device of claim 1, further comprising first spacers positioned on two sides of the upper portion.

3. The semiconductor device of claim 2, further comprising a top insulating layer positioned on sides of the first spacers.

4. The semiconductor device of claim 3, wherein a bottom surface of the top insulating layer is at a vertical level above a vertical level of bottom surfaces of the first spacers.

5. The semiconductor device of claim 4, wherein a top surface of the first insulating layer and top surfaces of the first conductive blocks are substantially coplanar.

6. The semiconductor device of claim 5, wherein a bottommost point of the peak portion is at a same vertical level as bottom surfaces of the first conductive blocks.

7. The semiconductor device of claim 5, wherein a bottommost point of the peak portion is at a vertical level lower than a vertical level of bottom surfaces of the first conductive blocks.

8. The semiconductor device of claim 6, wherein an angle between the two sides of the peak portion is between about 60 degree and about 80 degree.

9. The semiconductor device of claim 1, further comprising a bottom layer positioned below the buried insulating layer.

10. A semiconductor device, comprising:
a first insulating layer comprising a peak portion having a V-shaped cross-sectional profile and upper portions positioned on two ends of the peak portion;
first conductive blocks positioned on two sides of the peak portion;
a first filler layer positioned on the peak portion and positioned between the upper portions; and
a first work function layer positioned between the first insulating layer and the first filler layer;
wherein the first conductive blocks are spaced apart by the peak portion.

11. The semiconductor device of claim 10, wherein a bottommost point of the peak portion is at a vertical level lower than a vertical level of bottom surfaces of the first conductive blocks.

12. The semiconductor device of claim 11, further comprising a buried insulating layer positioned below the first conductive blocks, wherein the peak portion is extending to an upper portion of the buried insulating layer.

* * * * *